United States Patent
Hua et al.

(10) Patent No.: US 12,550,687 B2
(45) Date of Patent: Feb. 10, 2026

(54) WAFER EDGE DEPOSITION FOR WAFER LEVEL PACKAGING

(71) Applicant: Lam Research Corporation, Fremont, CA (US)

(72) Inventors: Xuefeng Hua, Foster City, CA (US); Jack Chen, San Francisco, CA (US); Ian Scot Latchford, Palo Alto, CA (US); Chia-Shin Lin, Taipei (TW); Chanthavisa Keovisai, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 151 days.

(21) Appl. No.: 18/042,078

(22) PCT Filed: Aug. 13, 2021

(86) PCT No.: PCT/US2021/046019
§ 371 (c)(1),
(2) Date: Feb. 17, 2023

(87) PCT Pub. No.: WO2022/040052
PCT Pub. Date: Feb. 24, 2022

(65) Prior Publication Data
US 2023/0317445 A1    Oct. 5, 2023

Related U.S. Application Data

(60) Provisional application No. 62/706,463, filed on Aug. 18, 2020.

(51) Int. Cl.
*H01L 21/02*    (2006.01)
*H01L 21/321*    (2006.01)
*H01L 21/66*    (2006.01)

(52) U.S. Cl.
CPC .. *H01L 21/02021* (2013.01); *H01L 21/02019* (2013.01); *H01L 21/02164* (2013.01);
(Continued)

(58) Field of Classification Search
None
See application file for complete search history.

(56) References Cited

U.S. PATENT DOCUMENTS

2008/0268614 A1* 10/2008 Yang .................... H01L 21/2007
                                                                438/455
2010/0255682 A1* 10/2010 Trickett ................ H01L 21/304
                                                                438/692

(Continued)

OTHER PUBLICATIONS

International Preliminary Report on Patentability dated Mar. 2, 2023 in PCT Application No. PCT/US2021/046019.
(Continued)

*Primary Examiner* — Stephanie P Duclair
(74) *Attorney, Agent, or Firm* — Weaver Austin Villeneuve & Sampson LLP

(57) ABSTRACT

Semiconductor processing methods and apparatuses are provided. Some methods include providing a first wafer to a processing chamber, the first wafer having a thickness, a beveled edge, a first side, and a plurality of devices formed in a device area on the first side, the device area having an outer perimeter, depositing an annular ring of material on the first wafer, the annular ring of material covering a region of the beveled edge and the outer perimeter of the device area, and having an inner boundary closer to the center point of the first wafer than the outer perimeter, bonding a second substrate to the plurality of devices and to a portion of the annular ring of material, and thinning the thickness of the first wafer.

26 Claims, 17 Drawing Sheets

(52) U.S. Cl.
CPC .... *H01L 21/02274* (2013.01); *H01L 21/3212* (2013.01); *H01L 22/12* (2013.01)

(56) References Cited

U.S. PATENT DOCUMENTS

| | | | |
|---|---|---|---|
| 2011/0065238 A1 | 3/2011 | Chiou et al. | |
| 2011/0104426 A1* | 5/2011 | Farooq .............. | H01L 21/02263 |
| | | | 428/68 |
| 2013/0328174 A1 | 12/2013 | La Tulipe, Jr. et al. | |
| 2014/0273480 A1* | 9/2014 | Previtali ........... | H01L 21/02005 |
| | | | 438/703 |

OTHER PUBLICATIONS

International Search Report and Written Opinion dated Dec. 9, 2021 in PCT Application No. PCT/US2021/046019.
TW Office Action and Search Report dated Dec. 31, 2024 in TW Application No. 110130243, with English Translation..
KR Office Action dated Jun. 12, 2025 in KR Application No. 10-2022-7044984, with English Translation.

* cited by examiner

WAFER EDGE DEPOSITION FOR WAFER LEVEL PACKAGING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Integrated circuit (IC) chips or dies are typically interfaced with other circuits using a package that can be connected to, e.g., a printed circuit board (PCB). The IC chip may have contact pads that connect to components of the IC chip by way of vertically extending vias and horizontally extending wires or traces. IC packaging involves interconnecting IC chips to external circuitry. In some cases, IC packaging includes wafer level packaging (WLP), which is an electrical connection technology that employs relatively large features, typically on the scale of micrometers. WLP strategies may involve wire bonding, in which the IC chip is mounted upright and wires are used to interconnect contact pads to external circuitry. WLP strategies may involve flip-chip bonding, where the IC chip is "flipped over" so that it faces down and its contact pads align with matching pads on an external circuit. Examples of WLP structures include redistribution wiring, bumps, and pillars.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The systems, methods and devices of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

In some embodiments, a method may be provided. The method may include providing a first wafer to a processing chamber, the first wafer having a thickness, a beveled edge, a first side, and a plurality of devices formed in a device area on the first side, the device area having an outer perimeter, depositing an annular ring of material on the first wafer, the annular ring of material covering a region of the beveled edge and the outer perimeter of the device area, and having an inner boundary closer to the center point of the first wafer than the outer perimeter, bonding a second substrate to the plurality of devices and to a portion of the annular ring of material, and thinning the thickness of the first wafer.

In some embodiments, the annular ring of material may be an oxide.

In some such embodiments the oxide may be a silicon oxide.

In some embodiments, the depositing may include plasma-enhanced chemical vapor deposition (PECVD).

In some embodiments, the annular ring of material may have a nominal height of between about 1.5 µm and about 30 µm.

In some embodiments, the annular ring of material may have a nominal radial thickness of between about 1 mm and 6 mm.

In some embodiments, the method may further include planarizing the annular ring of material to reduce a nominal height of the annular ring of material.

In some such embodiments, the planarizing may include etching the annular ring of material.

In some further such embodiments, the etching may include etching an annular region of the first wafer, the annular region overlapping with the annular ring of material.

In some further embodiments, the annular region may be substantially equal to the annular ring of material.

In some further embodiments, the method may further include determining, before the depositing, an edge profile of the plurality of devices at the outer perimeter of the device area, and adjusting, based on the determining, the etching conditions to cause the annular region to substantially cover the annular ring of material.

In some such embodiments, the planarizing may include chemical mechanical polishing (CMP) the annular ring of material.

In some such embodiments, the planarizing may include chemical mechanical polishing (CMP) and etching the annular ring of material.

In some embodiments, the method may further include removing, after the bonding, an edge portion of the first wafer that includes the beveled edge and the annular ring of material to thereby remove the beveled edge and the annular ring of material from the first wafer.

In some such embodiments, the edge portion may have a radial thickness of less than about 2 mm.

In some embodiments, the method may further include determining an edge profile of the plurality of devices at the outer perimeter of the device area, and adjusting, based on the determining, the deposition conditions to (i) cause the annular ring of material to cover the edge profile, (ii) cause a nominal height of the annular ring of material to be greater than a height of the plurality of devices, or both (i) and (ii).

In some such embodiments, the adjusting may include adjusting a separation distance between the first wafer and a gas distribution device configured to flow gases onto the first wafer, and/or adjusting a flowrate of a process gas flowed onto the first wafer during the depositing.

In some such embodiments, the determining may include measuring the edge profile of the first wafer.

In some such embodiments, the determining may include measuring the flatness of the first wafer.

In some such embodiments, the determining may include calculated information.

In some such embodiments, the adjusting may cause the inner boundary of the annular ring of material to be less than an inner radial boundary of the edge profile.

In some such embodiments, the adjusting may cause the inner boundary of the annular ring of material to be closer to the center point of the first wafer than an inner radial boundary of the edge profile.

In some embodiments, the depositing may further include generating a plasma over an annular edge region of the first wafer, and using a plasma exclusion zone to prevent the plasma from being generated closer to the center point of the first wafer than an inner boundary of the annular edge region.

In some embodiments, the method may further include forming through-silicon vias in the first wafer, the second substrate, or both.

In some embodiments, the second substrate may be a carrier substrate without a plurality of devices.

In some embodiments, the second substrate may include a second plurality of devices on a second side of the second substrate, and the bonding may further include bonding the second plurality of devices on the second substrate to the plurality of devices on the first wafer.

In some such embodiments, the method may further include depositing, before the bonding, a second annular ring of material on the second substrate. The second substrate may include a second beveled edge, the second plurality of devices may be formed in a second device area on the second side, the second device area may have a second outer perimeter, and the second annular ring of material may cover a second region of the second beveled edge and the outer perimeter of the second device area, and has an inner boundary closer to the center point of the second substrate than the second outer perimeter.

In some embodiments, a semiconductor processing system may be provided. The semiconductor processing system may include a processing chamber, a substrate support in the processing chamber, and the substrate support may include a center axis and a substrate support surface configured to support a substrate, a gas distribution device configured to flow process gases onto the substrate positioned on the substrate support, a plasma exclusion zone ring extending around the center axis of the substrate support and overlapping the substrate support surface when viewed along the center axis, one or more sensors configured to measure one or more characteristics of the wafer, a substrate transfer unit configured to provide the substrate to the substrate support, and a controller configured to provide a first wafer to the substrate support in the processing chamber, the first wafer having a thickness, a beveled edge, a first side, and a plurality of devices formed in a device area on the first side, the device area having an outer perimeter and an edge profile, receive one or more measured characteristics of the first wafer, determine, based at least in part on the one or more measured characteristics, deposition conditions for depositing an annular ring of material on the first wafer, and deposit the annular ring of material on the first wafer using the deposition conditions, the annular ring of material covering a region of the beveled edge and the outer perimeter of the device area, and having an inner boundary closer to the center point of the first wafer than the outer perimeter.

In some embodiments, the one or more sensors may include a laser configured to measure the edge profile.

In some embodiments, the one or more sensors may include a laser configured to measure the flatness of the first wafer.

In some embodiments, the controller may be further configured to etch, after the depositing, of the annular ring of material, wherein the etching is based, at least in part, on the determination.

DETAILED DESCRIPTION

Figure 1:
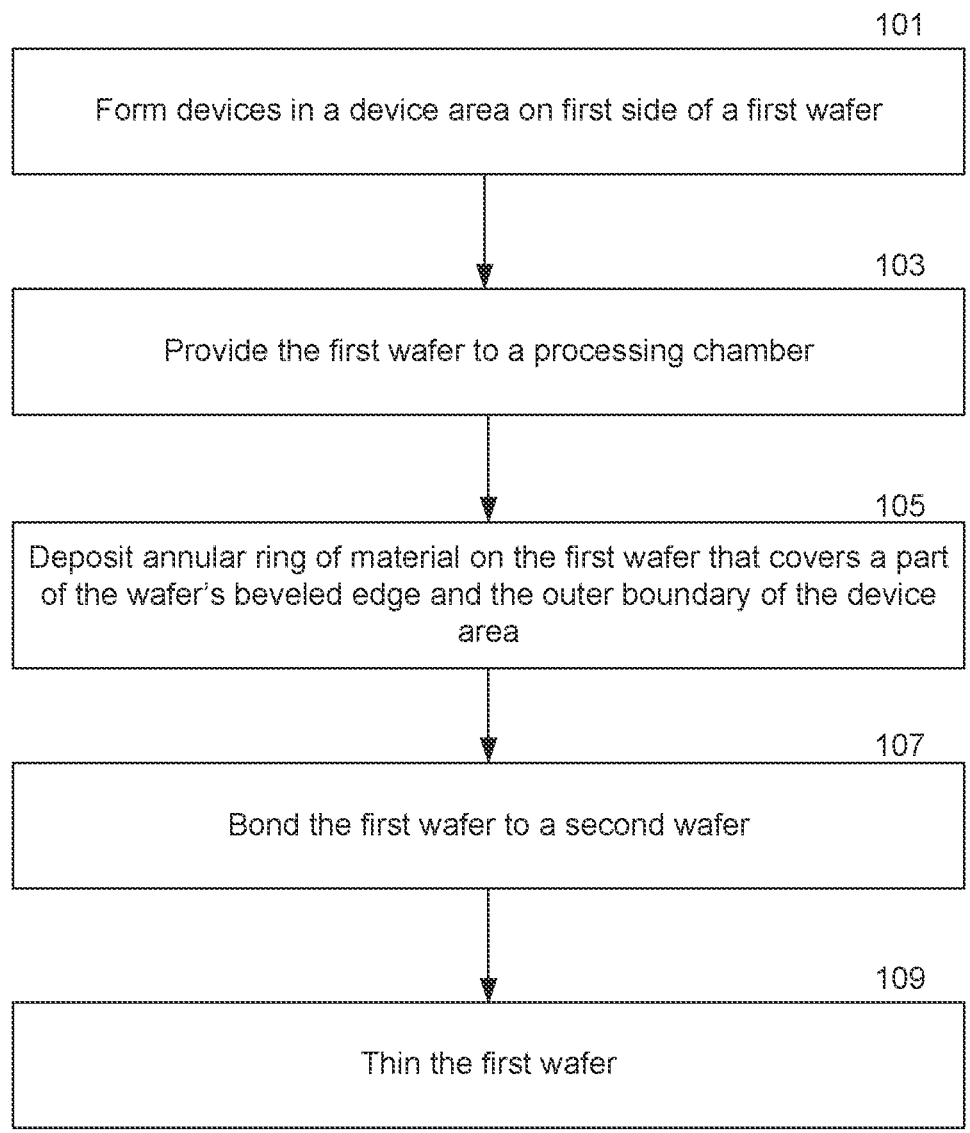
FIG. 1 depicts a first example technique according to some implementations.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction and Context

Advancements in materials, processing, and equipment have led to innovations in packaging technologies. Wafer level packaging, bumping, redistribution layers, fan out, and through-silicon vias (TSVs) are some of the techniques employed in advanced packaging. In many cases, integrated circuit packaging involves wafer level packaging (WLP), which is an electrical connection technology that employs relatively large features, typically on the scale of micrometers. Examples of WLP features include redistribution wiring, bumps, and pillars. Such features in WLP applications and advanced packaging applications may include copper.

Many WLP processes involve bonding two wafers together for various advantageous purposes, such as wafer stacking and enabling further processing of the backside of one or both wafers. For example, in some wafer stacking implementations, two wafers that each have devices processed thereon may be stacked onto each other to create more complex devices. This may include a face-to-face bonding in which the active devices face each other, or a back-to-face in which the back of one wafer faces the active devices of the other wafer. In some other examples, a processed wafer with active devices deposited thereon may be temporarily bonded to a carrier wafer that provides additional mechanical support to the processed wafer and allows it to be further processed without damaging the wafer. The additional processing on the backside of the processed wafer may include, for instance, wafer thinning, plating, bond pad formation, planarization, TSV revealing/exposure, and/or bumping.

Although bonding two wafers together is advantageous to WLP processing, it can lead to undesirable wafer damage and yield reduction. In general, a wafer includes partially, or fully fabricated devices formed on an interior region of the wafer, and a circumferential outer edge region that does not have any devices. WLP processing can unintentionally damage this outer edge region by causing cracking or chipping of the wafer and its devices thereby reducing the yield of the wafer. One conventional technique for reducing damage to a wafer's beveled edge is trimming the beveled edge of the wafer before bonding. Some implementations of edge trimming use a blade to mechanically remove material from the wafer's edge. This edge trimming can reduce some unwanted damage during wafer handling, but it still may present several disadvantages. For example, the edge trimming process can reduce some of the device yield and can generate particles that may adversely affect the wafer's devices. During some post-bonding processing, such as during wafer thinning, unwanted chipping, particle generation, and cracking of the wafer can all still occur. It is therefore desirable to minimize and eliminate the damage to the wafer's outer edge.

Example Techniques

Provided herein are new techniques and apparatuses for reducing damage to a wafer's beveled edge during WLP processing. In some embodiments, an annular ring of material is deposited on the wafer to cover a part of the beveled edge and the outer perimeter of the area in which the devices are formed. This annular ring of material provides mechanical support to the beveled edge by filling a gap between this wafer and the other wafer to which it is bonded to reduce damage to this wafer by, for instance, reducing chipping, protecting the wafer's edge, preventing edge die loss, and providing a high-quality bond with the other wafer. In some embodiments, after the annular ring of material is deposited, it may undergo further processing to change its geometry which may include planarizing by various processes, such as chemical mechanical polishing (CMP), etching, or both. The annular ring of material may be, in some instances, a dielectric such as an oxide, including a silicon oxide, which may reduce interference with the wafer's devices.

FIG. 1 depicts a first example technique according to some implementations. Each operation of technique 100 will be discussed in greater detail below, but in general this technique 100 includes operation 101 in which devices are formed on a first wafer, operation 103 in which the first wafer is provided to a process chamber, operation 105 in which an annular ring of material is deposited on the first wafer, operation 107 in which the first wafer is bonded to a second wafer, and operation 109 in which the first wafer is thinned.

Figure 2A:
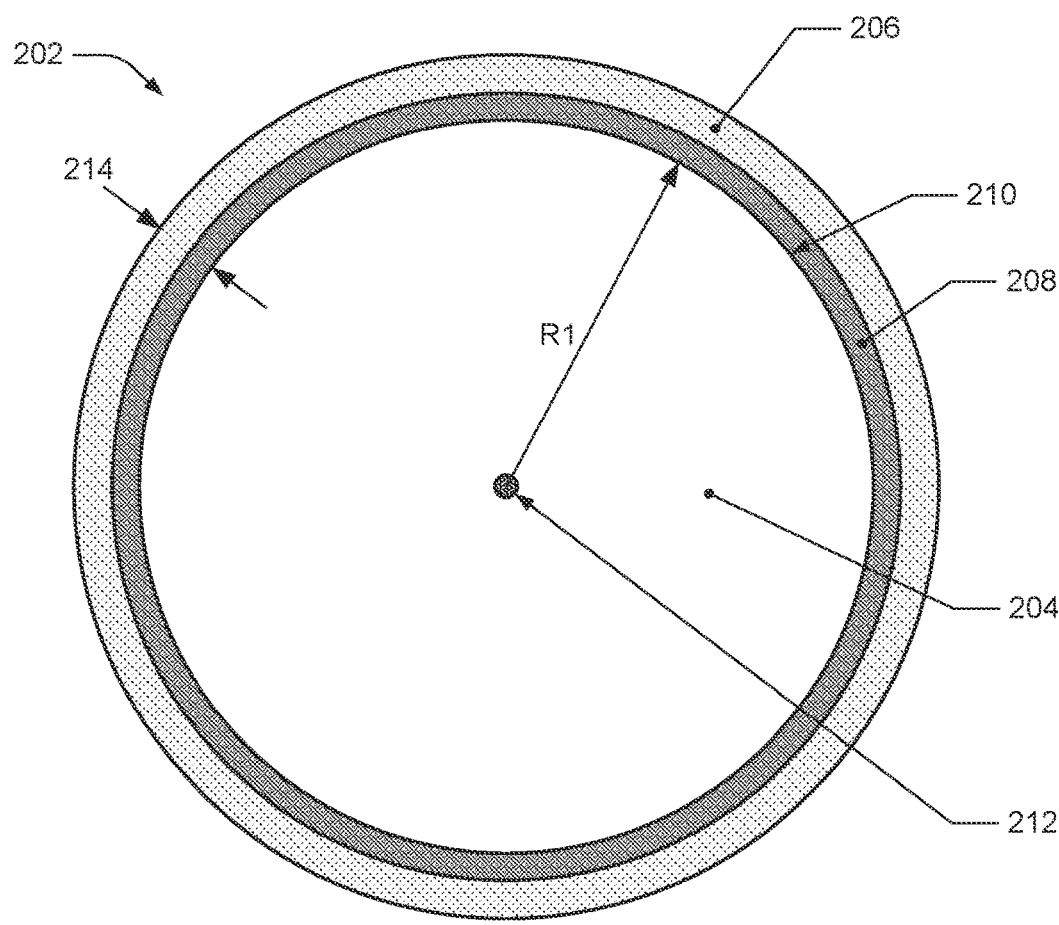
FIG. 2A depicts a top view of an example wafer.
Figure 2B:
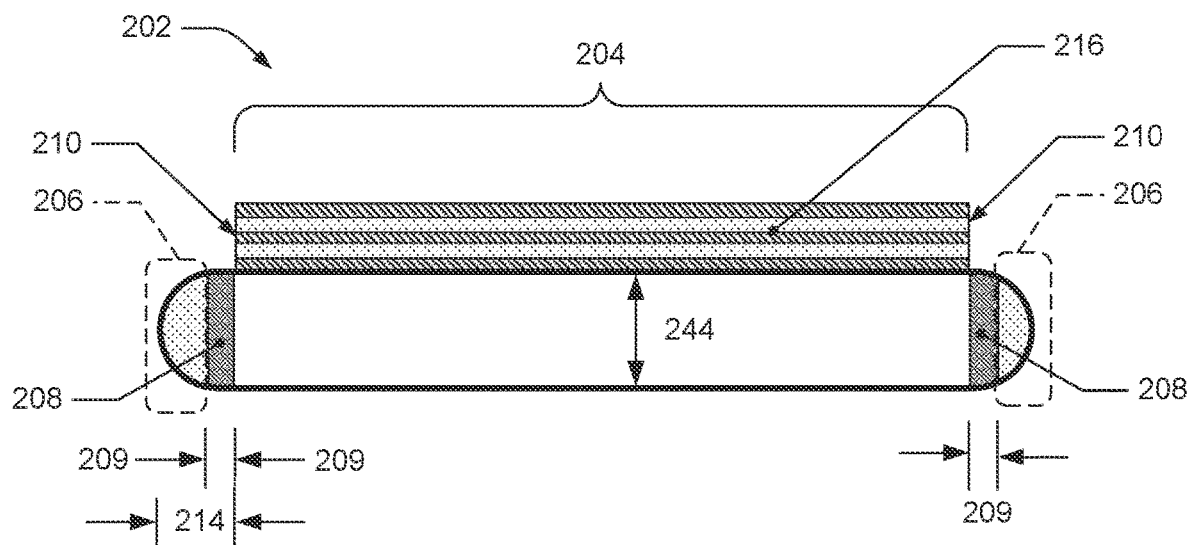
FIG. 2B depicts a side view of the example wafer of FIG. 2A.

In operation 101 of technique 100, before bonding between two wafers occurs, the devices are partially or fully formed on the first wafer. This may include multiple and different processing steps, such as various deposition and etching operations. These devices are formed in a device area on a first side of the first wafer; this area and other features of a wafer are illustrated in FIG. 2A which depicts a top view of an example wafer and FIG. 2B which depicts a side view of the example wafer of FIG. 2A. The wafer 202 in FIG. 2A includes a device area 204 in which the plurality of devices, not shown, are formed, and an outer perimeter 210 of the device area 204 having a radius R1 that begins at the wafer center point 212. The wafer 202 further includes a beveled edge 206, and an annular edge region 208 that spans between the outer perimeter 210 of the device area 204 and the beveled edge 206. FIG. 2B also shows the device area 204 and its outer perimeter 210, the beveled edge 206 (identified within the dashed box and with light shading), the annular edge region 208 (identified with dark shading) having an annular thickness, or width, 209, and the plurality of devices 216 in the device area 204. The wafer 202 may also include an annular region 214 that covers both the beveled edge 206 and the annular edge region 208, and has an inner boundary the coincides or overlaps with the outer perimeter 210 of the device area 204.

Although the annular edge region 208 and the outer perimeter 210 are clearly defined shapes with clearly defined boundaries, in practice and operation these shapes and boundaries may not be as exact because of the inexact and imprecise nature of some semiconductor processing (e.g., variability of gas flows and gas volumes). Accordingly, in some embodiments these annular shapes and boundaries may be considered average nominal radiuses, boundaries, circumferences, and diameters. For instance, the outer perimeter of the device area and/or the inner boundary of the annular edge region may have variable boundaries that are not perfect circles but can each be defined as an average nominal radius and circumference.

Referring back to FIG. 1, following operation 101, the first wafer is provided to a processing chamber in operation 103. One or more wafer handling robots may provide the substrate to the processing chamber and position the wafer onto a wafer support, such as a pedestal or electrostatic chuck. The processing chamber is configured to deposit an annular ring of material on the first wafer and is described in more detail below.

Figure 3A:
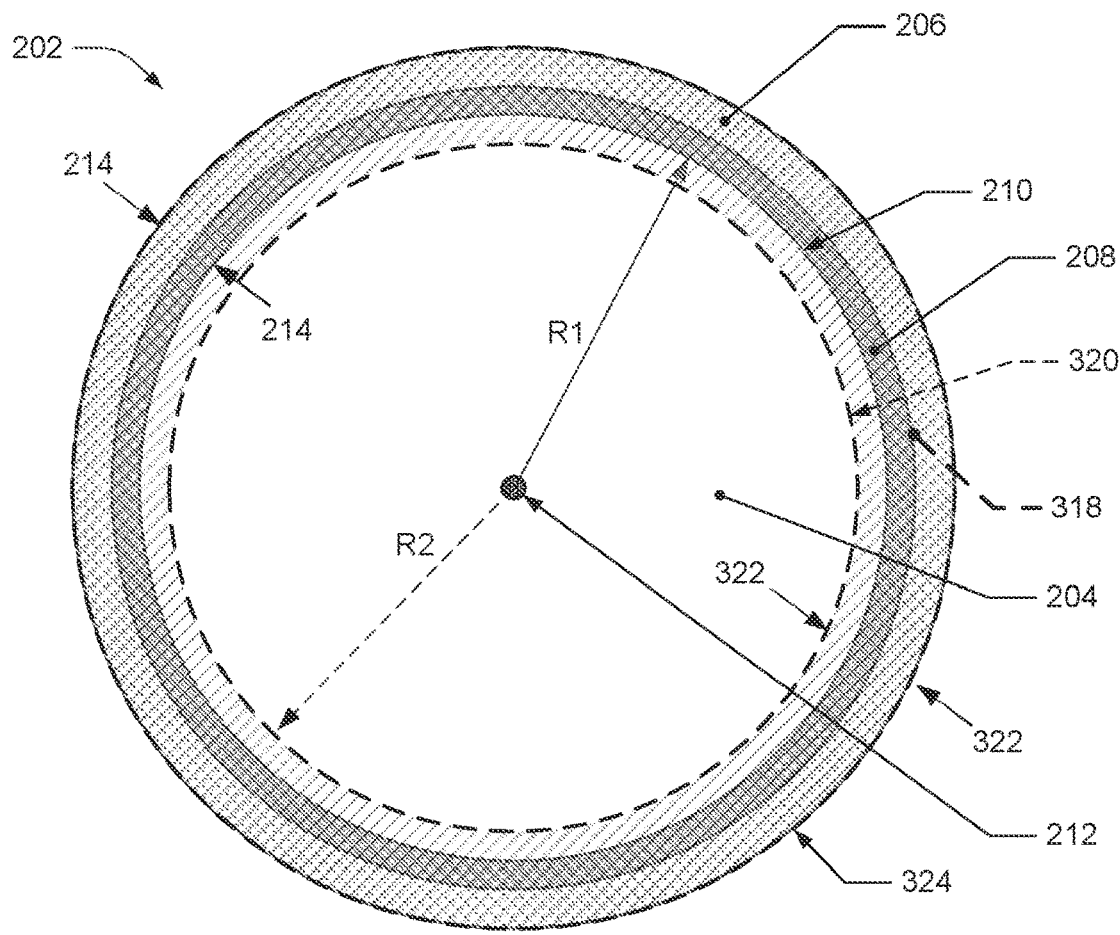
FIG. 3A depicts a top view of an annular ring of material deposited on the example wafer of FIG. 2A.

In operation 105, the annular ring of material is deposited on the first wafer such that it covers a region of the beveled edge and the outer perimeter of the device area. In some embodiments, this annular ring of material spans from the beveled edge to an inner boundary that is closer to the center point of the wafer than the outer perimeter of the device area. FIG. 3A depicts a top view of an annular ring of material deposited on the example wafer of FIG. 2A and FIG. 3B depicts a cross-sectional side view of the example wafer of FIG. 3A.

In FIG. 3A, the annular ring of material is represented by the semi-transparent cross-hatched annular ring having a dashed outline identified with identifier 318. As can be seen, this annular ring of material 318 covers the outer perimeter 210 of the device area 204, at least a portion of the beveled edge 206, and the annular edge region 208. The annular ring of material 318 includes an inner boundary 320 having a radius R2 that is less than the outer perimeter 210 of the device area 204 and its radius R1. In some embodiments, this may result in an annular or radial thickness 322 of this annular ring of material 318 being greater than the annular thickness of the annular edge region 214.

Figure 3B:
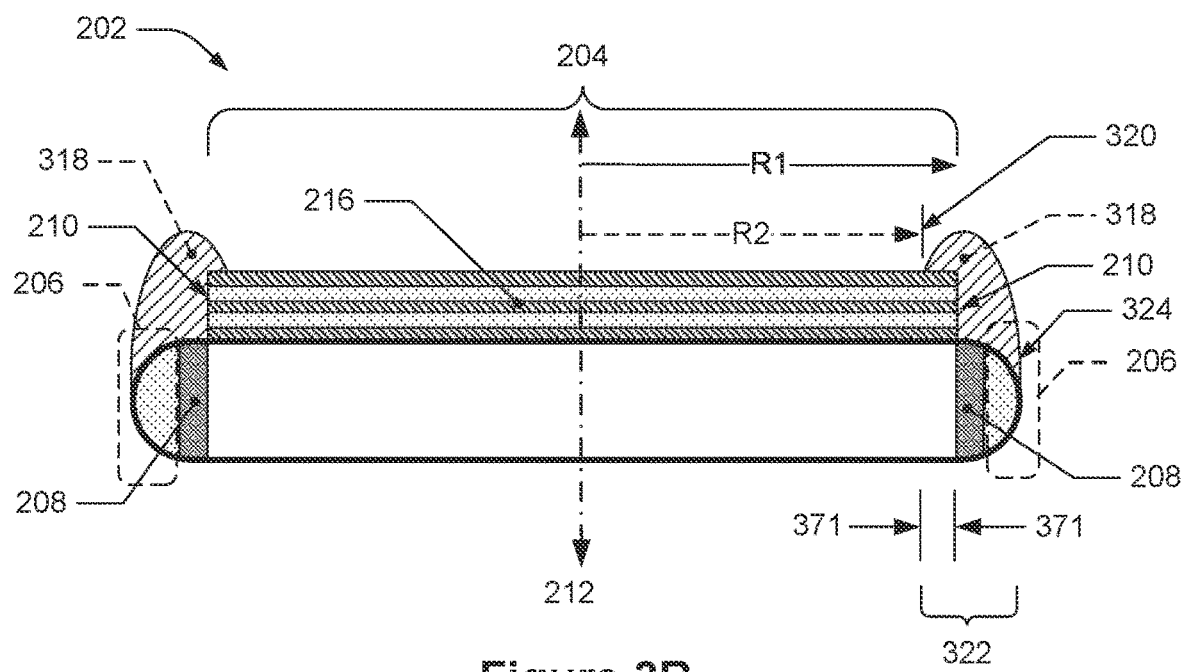
FIG. 3B depicts a side view of the example wafer of FIG. 3A.

In FIG. 3B, two slices of the annular ring of material 318 are shown. Here, the annular ring of material 318 has been deposited over and on a portion 371 of the device area 204, the outer perimeter 210 of the device area 204, the annular edge region 208, and a portion of the beveled edge 206. The inner boundary 320 of the annular ring of material 318 is shown closer to the center 212 of the wafer 202, and therefore with a smaller nominal radius R2 than the outer perimeter 210 of the device area. The portion 371 of the device area 204 on which the material is deposited spans from the inner boundary 320 to the outer perimeter 210. As further shown, the outer boundary 324 of the annular ring of material 318 reaches the outer boundary of the beveled edge 206. In some embodiments, the outer boundary 324 of the annular ring of material 318 may be at the substantially same location as the outer boundary of the beveled edge 206; this may be within 10% or 5% of each other, for instance. In some other embodiments, the outer boundary of the annular ring of material may not reach the outer boundary of the beveled edge, but may still be positioned on a portion of the beveled edge.

Figure 3C:
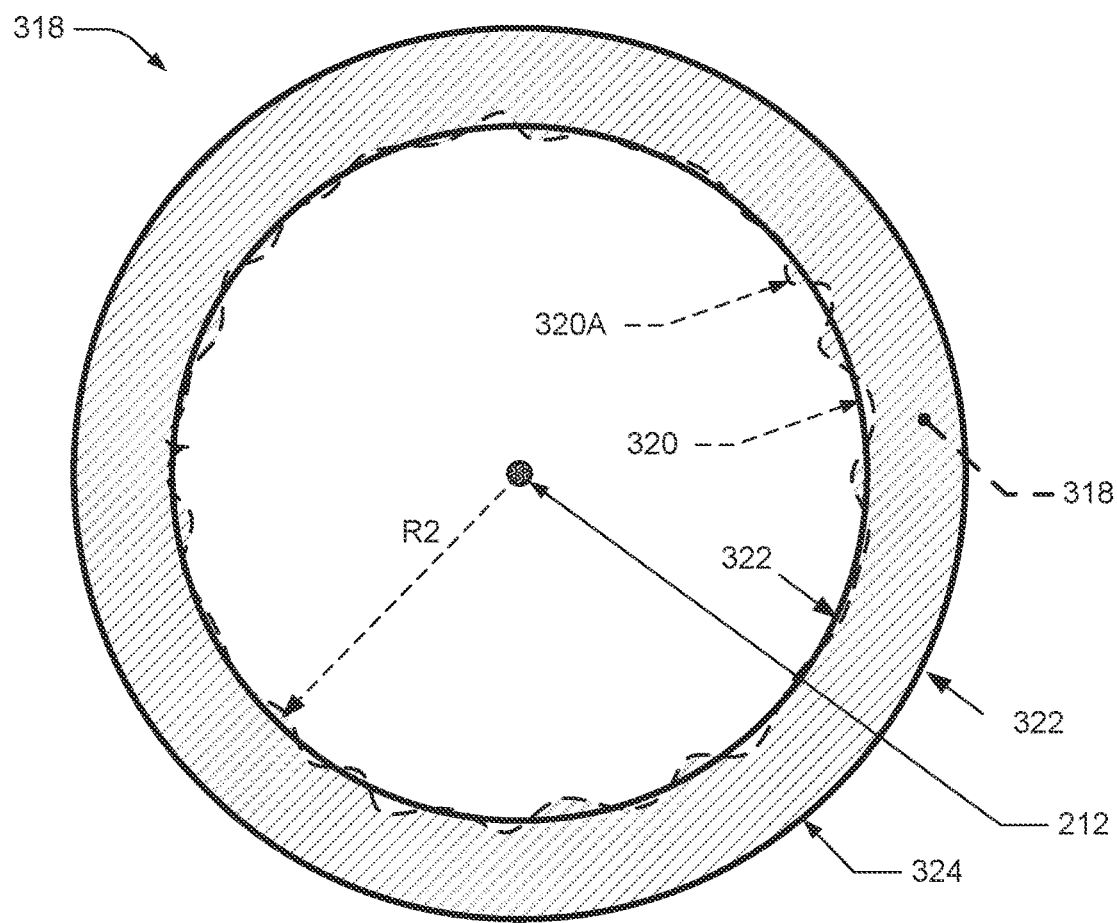
FIG. 3C depicts the annular ring of material and an imprecise inner boundary.

As noted herein, in some embodiments, the annular ring of material 318 may have a radius R2, an inner boundary 320 and an outer boundary 324 that are not exact and precise given the imprecise nature of some processing operations, but instead may be variable around the center 212 of the wafer 202; these features may therefore be considered, respectively, an average nominal radius and average nominal boundaries. For instance, an annular ring of material may have a variable inner boundary that is not a perfect circle but can be defined as having an average nominal radius and circumference. For instance, as shown in FIG. 3C, the annular ring of material is depicted 318 along with an actual, imprecise inner boundary 320A that is considered to have an average radius R2 and an average circumference 320. The average radius and average circumference may be used to define the annular ring of material. Similarly, the annular thickness of the annular ring of material may not be constant around the center of the wafer; it may be a variable thickness, but still be considered a substantial ring.

In some embodiments, the annular ring of material may include an oxide, such as a silicon oxide. "Silicon oxide" is referred to herein as including chemical compounds including silicon and oxygen atoms, including any and all stoichiometric possibilities for $Si_xO_y$, including integer values of x and y and non-integer values of x and y. For example, "silicon oxide" includes compounds having the formula $SiO_n$, where $1 \leq n \leq 2$, where n can be an integer or non-integer values. "Silicon oxide" can include sub-stoichiometric compounds such as $SiO_{1.8}$. "Silicon oxide" also includes silicon dioxide ($SiO_2$) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates.

The annular ring of material may also include, in some instances, a silicon oxynitride compound. This may include chemical compounds including silicon, oxygen, and nitrogen atoms, including all stoichiometric possibilities for $SiO_xN_y$, including integer values of x and y and non-integer values of x and y.

Figure 3D:
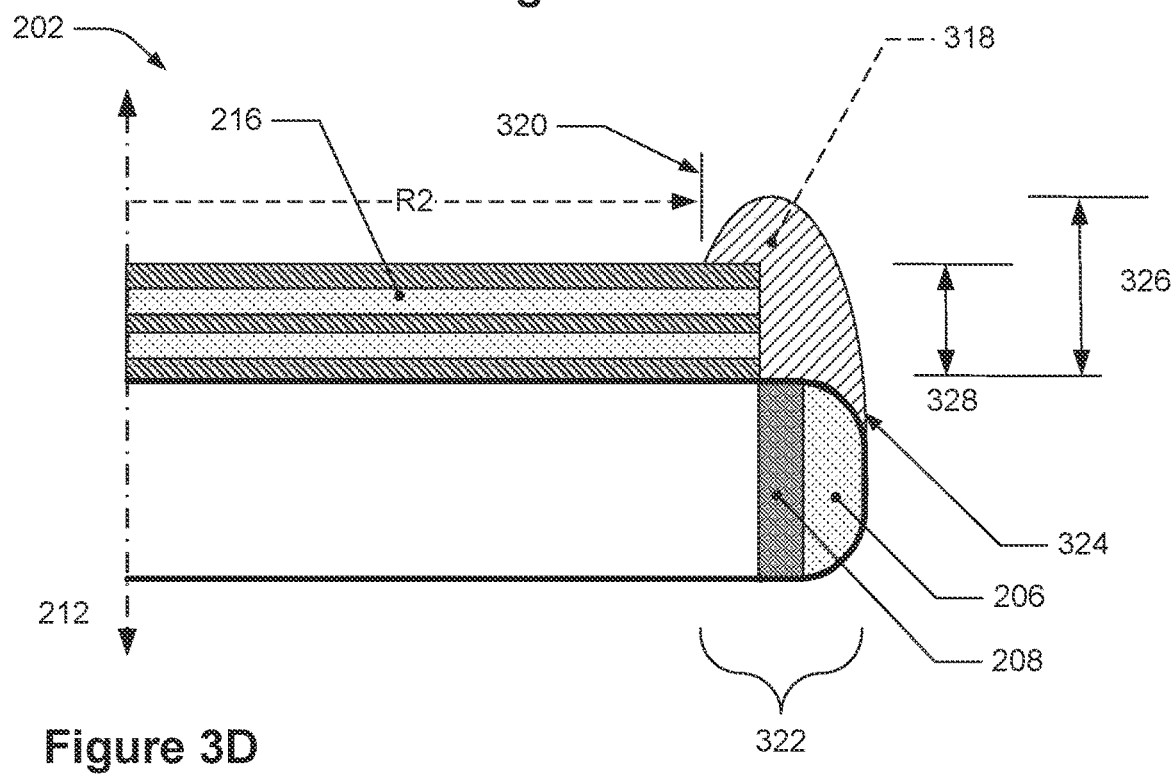
FIG. 3D depicts a magnified section of the right side of the wafer of FIG. 3B.

The geometry of the annular ring of material may vary and, in some instances, may be based on the geometry of the outer perimeter of the device area. This may be advantageous to subsequent processing of the wafer, such as by providing structural support when bonded to a second wafer, providing a better-quality bond, and by enabling less of the wafer to be trimmer; these may in turn protect the wafer and prevent cracking, chipping, and other damage. For example, the annular ring of material may be deposited in order to have a height, or average height, that is greater than the height of the devices formed on the wafer. This height may, in some instances, provide structural support and high-quality bonding when the wafer is bonded to a second wafer. Referring to FIG. 3D, which depicts a magnified section of the right side of the wafer of FIG. 3B, the height 326 of the annular ring of material 318 is greater than the height 328 of the devices 216. In some embodiments, this nominal, average height 326 of the annular ring of material 318 may range between about 1.5 μm and about 30 μm, between about 2 μm and about 15 μm, or between about 5 μm and about 15 μm, for instance.

Figure 4A:
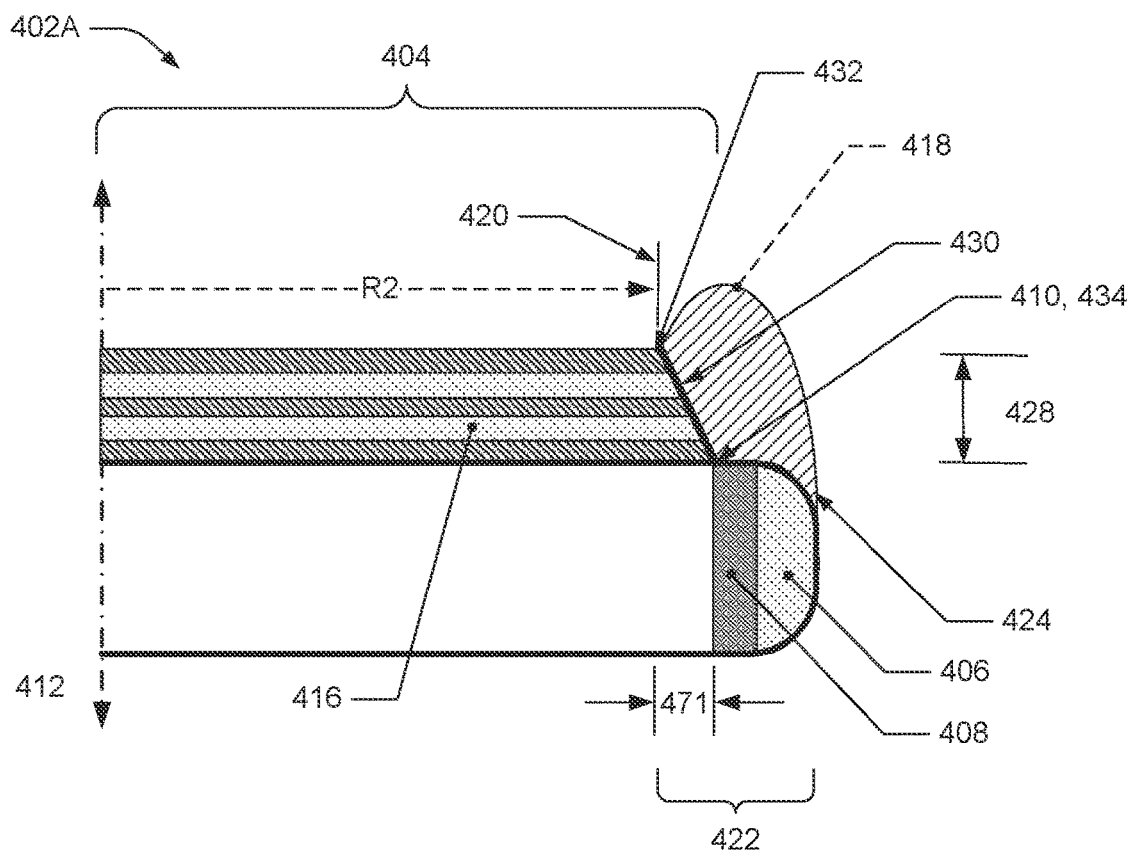
FIG. 4A depicts the right-side cross-sectional slice of an example wafer.
Figure 4B:
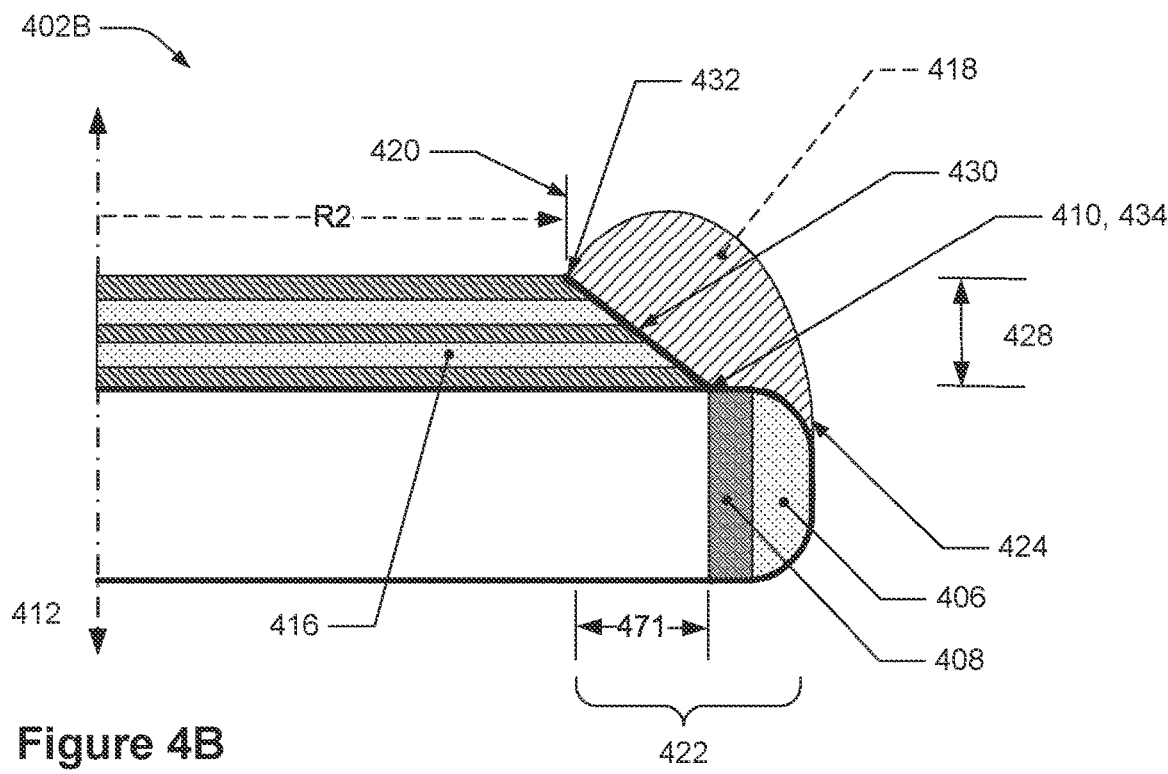
FIG. 4B depicts the right-side cross-sectional slice of another example wafer.

Similarly, the annular ring of material's radial thickness, inner boundary, and outer boundary may be configured to cover the outer perimeter and at least a portion of the device area's outer edge region. For instance, the device area may have an outer edge region that decreases or transitions from a first height to a smaller height. The outer edge region may have, for example, a linear, non-linear, stepped, and/or curved profile, as well as a slope. The annular ring may be deposited such that its inner boundary covers this outer edge region, and the outer perimeter, of the device area. FIG. 4A depicts the right-side cross-sectional slice of an example wafer and FIG. 4B depicts the right-side cross-sectional slice of another example wafer. These Figures show the right side of the cross-sectional slice from the center axis 412 of the wafers 402A and 402B, respectively.

In FIG. 4A, the device area 404 of wafer 402A includes an edge region 430 that has a linear profile or slope that begins at a first point 432 (which may also be considered an inner radial boundary of the edge profile 430) and decreases in height as the radial distance increases; here, this slope extends downwards from a first height 428 at the first point 432 to a second point 434 with a smaller height than the first height 428 that in this Figure is a surface of the wafer itself. This second point 434 may be considered the outer perimeter 410 of the device area. The annular ring of material, including its annular thickness 422, is configured such that its inner boundary 420 is radially inwards from some or all of this edge region 430 and that it covers the outer perimeter 410. As shown, the inner boundary 420 may be positioned on, or substantially on (e.g., within +/−5%), the first point 432 of the edge region 430 of the device area 404. Here in these Figures, the portion 471 of the device area 404 on which the annular ring of material 418 covers extends between the outer perimeter 410 and the second point 434, and the inner point 432.

Similarly, in FIG. 4B the edge region 430 has a different, more gradual slope than in FIG. 4A and the annular ring of material 418 has a larger annular thickness 422 than in FIG. 4A to accommodate this edge region 430. The annular ring of material may therefore be adjusted and configured to cover at least a part of various edge regions on wafers. This may include adjusting the inner boundary and annular thickness of the annular ring of material which may be accomplished by controlling and/or adjusting various deposition conditions, as described in more detail below.

In some embodiments, although not shown in FIG. 4A, the portion 471 of the device area 404 and the inner boundary of the annular ring of material 418 may be radially closer to the center axis 412 than the edge region 430 and thus may cover more of the device area 404, For example, the annular ring of material may cover the annular edge as well as an additional annular region of the device area, similar to the illustrations of 3A, 3B, and 3D. As seen in these Figures, in some embodiments, the average radial thickness 322 of the annular ring of material 318 may be greater than the distance between the beveled edge 206 and the outer perimeter 210 of the device area so that the deposited ring of material can cover this outer perimeter 210 and at least some of the beveled edge 206. In some implementations, the average radial thickness 322 of the annular ring of material 318 may range between about 0.5 mm and 10 mm, about 1 mm and about 7 mm, or about 1 mm and 5 mm, for instance.

In some embodiments, the annular ring of material is deposited using CVD or PECVD. In a typical PECVD reaction, a substrate is heated to an operating temperature and exposed to one or more volatile precursors which react and/or decompose to produce the desired deposit on the substrate surface. The PECVD process generally begins by flowing one or more reactants into the reaction chamber. The reactant delivery may continue as a plasma is generated which exposes the substrate surface to the plasma, which in turn causes deposition to occur on the substrate surface. This process continues until a desired film thickness is reached, after which the plasma is generally extinguished and the reactant flow is terminated. In some embodiments, the plasma may be generated using any known technique, including, for instance, a continuous radio frequency (RF) plasma or a pulsed RF plasma.

In some embodiments, depositing the material in an annular ring shape may be accomplished by using a processing chamber that includes a plasma exclusion zone ring around the wafer that prevents plasma from being generated inside the zone and thereby prevents the deposition from occurring within the zone, but that allows plasma to be generated outside the zone and on an annular outer region of the wafer. This is explained in greater detail below.

Figure 5A:
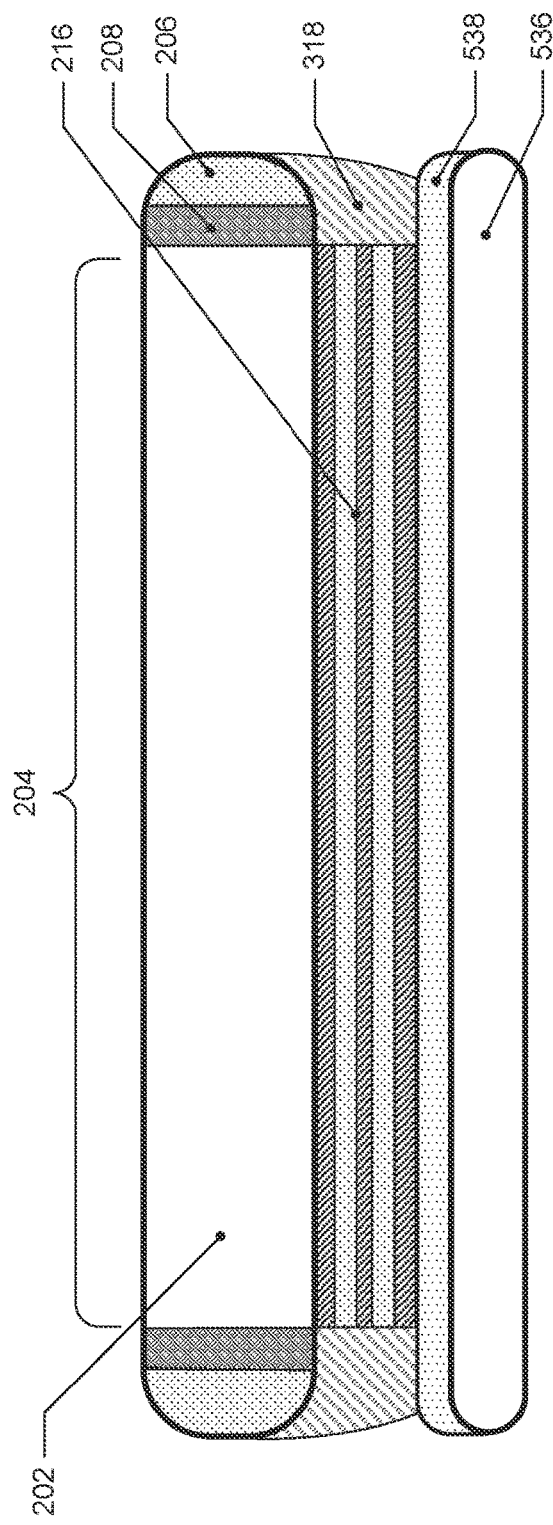
FIG. 5A depicts an example bonding between two wafers.

Referring back to FIG. 1, after the annular ring of material has been deposited on the wafer in operation 105, the wafer may be bonded to a second wafer as represented by operation 107. In some embodiments, the annular ring of material and at least some of the plurality of devices are bonded to the second wafer. In some such instances, the bonding may use a bonding material, such as an adhesive liquid, gel, or tape, that is positioned between the two wafers and adheres to some of the devices and the annular ring of material. FIG. 5A depicts an example bonding between two wafers and shows the first wafer 202, from FIG. 3B that includes the deposited annular ring of material 318, bonded to a second wafer 536 with a bonding material 538. As illustrated, the bonding material 538 is contacting and adhered to the second wafer 536, the annular ring of material 318, and at least some of the plurality of devices 216 in the device area 204.

Figure 5B:
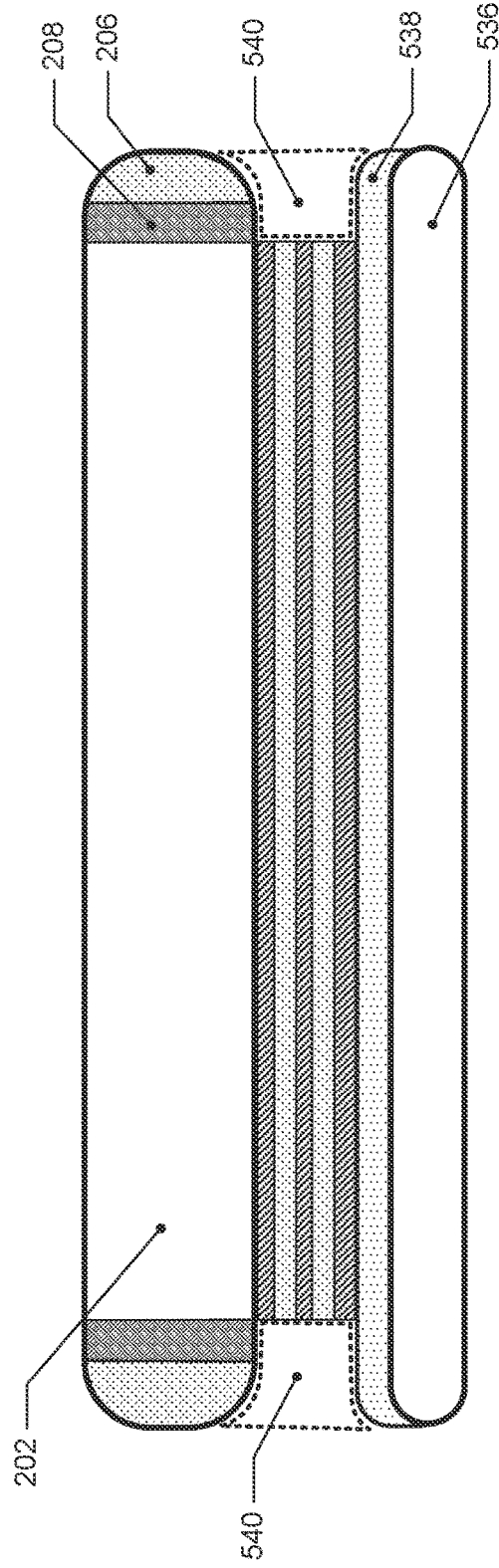
FIG. 5B depicts an example bonding between the two wafers of FIG. 5A without a deposited annular ring of material.

Once bonded, as can be seen, the annular ring of material 318 provides structural support to an area outside the device area 204 that includes, in some instances, the beveled edge 206 and the annular edge region 208. This deposited annular ring of material 318 fills at least some of the void between the beveled edge 206 and the annular edge region 208 that would exist without this deposited material. FIG. 5B depicts an example bonding between the two wafers of FIG. 5A without a deposited annular ring of material. As can be seen, a void 540 exists between the two wafers and exposes the beveled edge 206 and the annular edge region 208 to damage. By filling this void as seen in FIG. 5A, the annular ring of material 318 provides structural support that protects the beveled edge 206 and the annular edge region 208 from damage, such as cracking and chipping, that may occur during wafer handling and/or processing.

In some embodiments, the annular ring of material may improve bonding between the two wafers. This may include providing additional surface area to which a bonding material, such as an adhesive gel, may contact and bond. This may alternatively or additionally include providing a better material to which the bonding material may bond. For instance, the bonding material may bond stronger to the material in the annular ring of material than to material(s) in the wafer's devices. For example, a silicon gel bonding material may create a stronger bond with a silicon oxide annular of material than with devices that include metals.

In some instances, the second wafer may be a carrier wafer that does not have any devices deposited thereon, while in some other instances it may be a wafer with partially or fully formed devices deposited thereon. As provided above, some processed, first wafers are vulnerable to damage and stress during handling and/or processing operations and bonding these wafers to a carrier wafer can provide added structural support to minimize damage during processing and/or handling. Many carrier wafers are configured to withstand physical, mechanical, and thermal forces, as well as chemical exposures (e.g., to volatile chemicals and processing). The carrier wafers may be comprised of a silicon, a glass, a quartz, or a combination, and they may have various surface geometries that are configured to interface with the processed, first wafer which may include a planar surface with less than about 1 μm variation. The second wafer 536 shown in FIG. 5A may be considered a carrier wafer because it does not include any devices deposited thereon.

The bonding between a carrier wafer and a first wafer may be a temporary bond. This enables the carrier wafer to provide the desired support during some of the processing, and then to be removed from the first wafer without damaging the first wafer. In some embodiments, the temporary bond may be a temporary adhesive compound, such as adhesive layers or tapes, that are positioned in-between the first wafer and the carrier wafer. This temporary bond may be removed, or debonded, following processing by various techniques, such as chemically dissolving the adhesive compound or using thermal or radiation to decompose the adhesive. After this removal, the first wafer and the carrier wafer may be physically separated from each other, including by a thermal slide process in which the first wafer and the carrier are held by chucks (e.g., electrostatic or vacuum), heat is applied, and the wafers slide apart from each other.

In some embodiments, the first wafer may be bonded to a second wafer that has partially or fully fabricated devices thereon. This bonding may be a face-to-face bonding in which the active devices face each other, or a back-to-face in which the back of one wafer faces the active devices of the other wafer. In some instances, this bonding may be a permanent bond. For example, two wafers with dielectrics and metals deposited thereon may be bonded together in various face-to-face manners. This may include bringing the exposed dielectric surfaces on each wafer in contact with each other which may cause the dielectrics to bond at room temperature. After this, in some instances, the two wafers may be heated which can cause the metals to bond with each other. This metal-to-metal bonding may occur because the coefficient of thermal expansion for the metals is greater than the dielectrics, which causes the metals to expand and become internally pressurized. In some other embodiments, only the dielectrics on the wafers may be bonded together or only the metals on the wafers may be bonded together. In some such instances, the dielectric-to-dielectric bonding may be a mechanical bond and the metal-to-metal bonding may be both mechanical and electrical bonds.

Figure 5C:
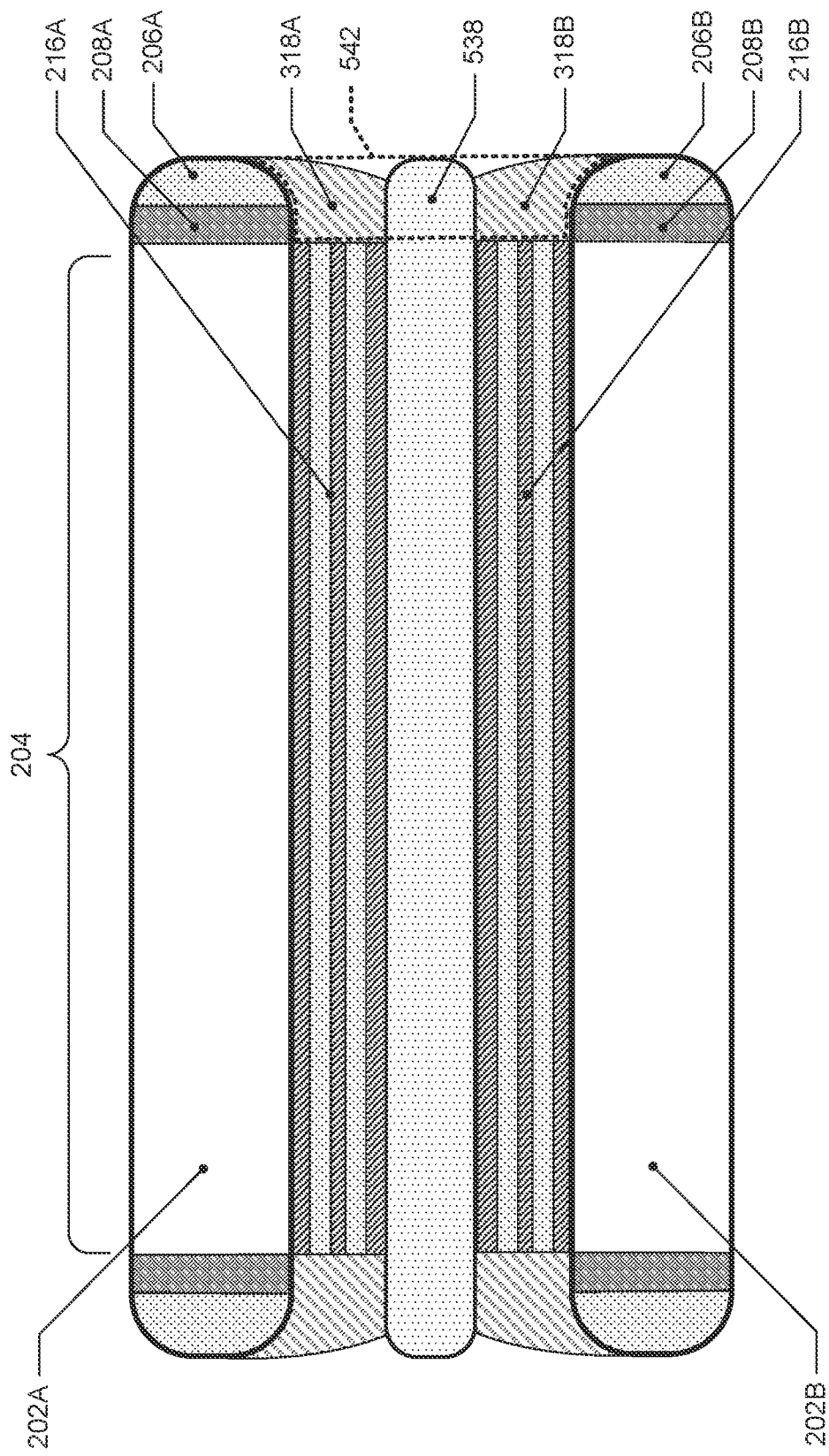
FIG. 5C depicts another example bonding between two wafers.
Figure 5D:
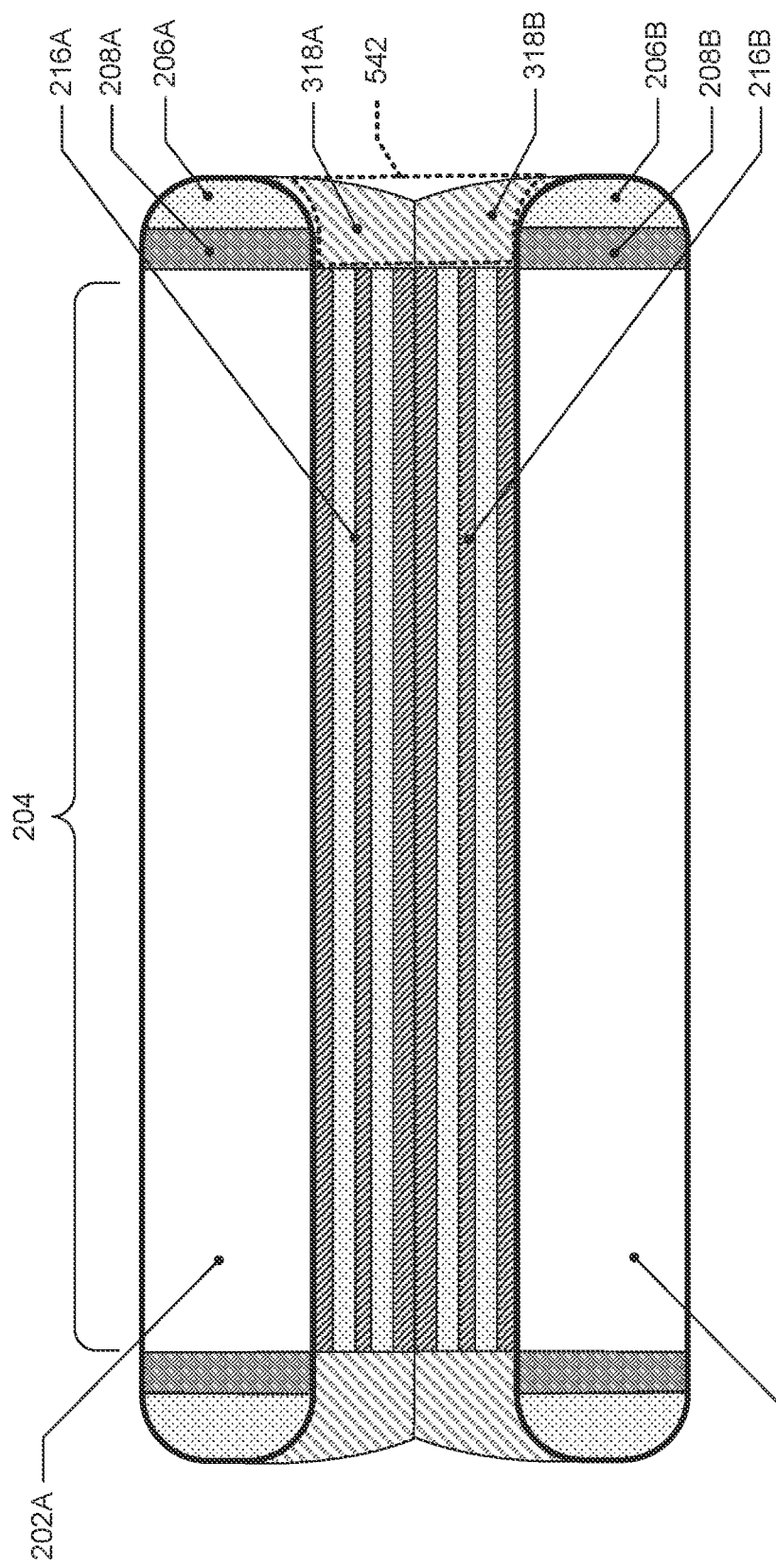
FIG. 5D depicts yet another example bonding between two wafers.

Some embodiments of bonding together two wafers with devices deposited thereon may include depositing annular rings of material on both the wafers before bonding. This may provide additional structural support and/or bonding improvements to both wafers. FIG. 5C depicts another example bonding between two wafers and as can be seen, both wafers 202A and 202B each have a plurality of devices 216A and 216B, respectively, deposited thereon along with annular rings of material 318A and 318B, respectively. A bonding material 538 is seen positioned between the two wafers 202A and 202B in order to bond them together. Here, the two annular rings of material 318A and 318B both support the wafers by filling and supporting the area 542 between the wafers that includes the beveled edges 206A and 206B, and the annular edge regions 208A and 208B. In some instances, such as illustrated in FIG. 5D which depicts yet another example bonding between two wafers, a bonding material may not be included and the wafers may be bonded using any of the above techniques, such as the metal-to-metal, dielectric-to-dielectric bonding, or both. The annular rings of material 318A and 318B may therefore also be in direct contact with each other and, in some instances, bonded to each other with a dielectric-to-dielectric bond that may occur at room temperature and followed, in some embodiments, by one or more heating sequences. In some instances, a bonding material may be positioned between the two annular rings of material 318A and 318B and not between the plurality of devices 216A and 216B.

Figure 6:
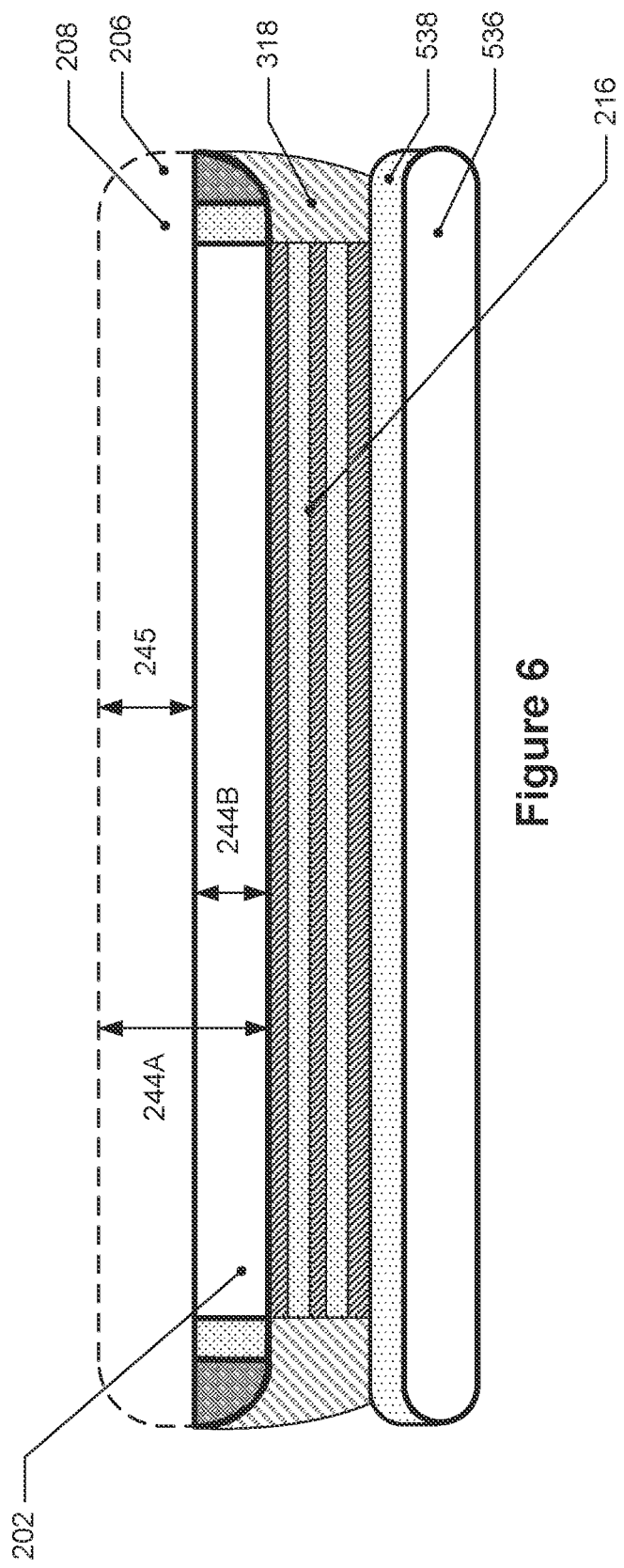
FIG. 6 depicts the first and second wafers of FIG. 5A after a thinning operation.

Referring back to FIG. 1, after the bonding of operation 107 the first wafer is thinned in operation 109. This thinning reduces the thickness (item 244 in FIG. 2B) of the first wafer by removing wafer material; this may be considered wafer grinding or thinning. FIG. 6 depicts the first and second wafers of FIG. 5A after a thinning operation. Here, the first wafer 202 has been thinned such that it's thickness 244A before the thinning operation was reduced to a smaller thickness 244B and the material 245 was removed. The first wafer's 202 original thickness is represented by the dashed shape to show the reduced thickness caused by the thinning operation. Some wafer thinning includes a coarse grind in which a bulk of the material is removed, followed by a fine grind to smooth the wafer. Wafer thinning provides for thin microchips and in some instances, enables further processing of the wafer, such as exposing features of a wafer, e.g. TSVs, upon that can processed, e.g., filling the TSVs with electroplating. In some embodiments, the wafer may be reduced by at least about 50 µm, at least about 40 µm, or at least about 20 µm, for example.

In some embodiments, the operations of the technique in FIG. 1 may be performed in other orders. For instance, the thinning operation 109 may be performed before the bonding operation 107 or before the deposition operation 105.

Some techniques provided herein may have other optional operations, such as forming and filling TSVs, planarizing the deposited annular ring of material, and trimming the wafer.

Figure 7:
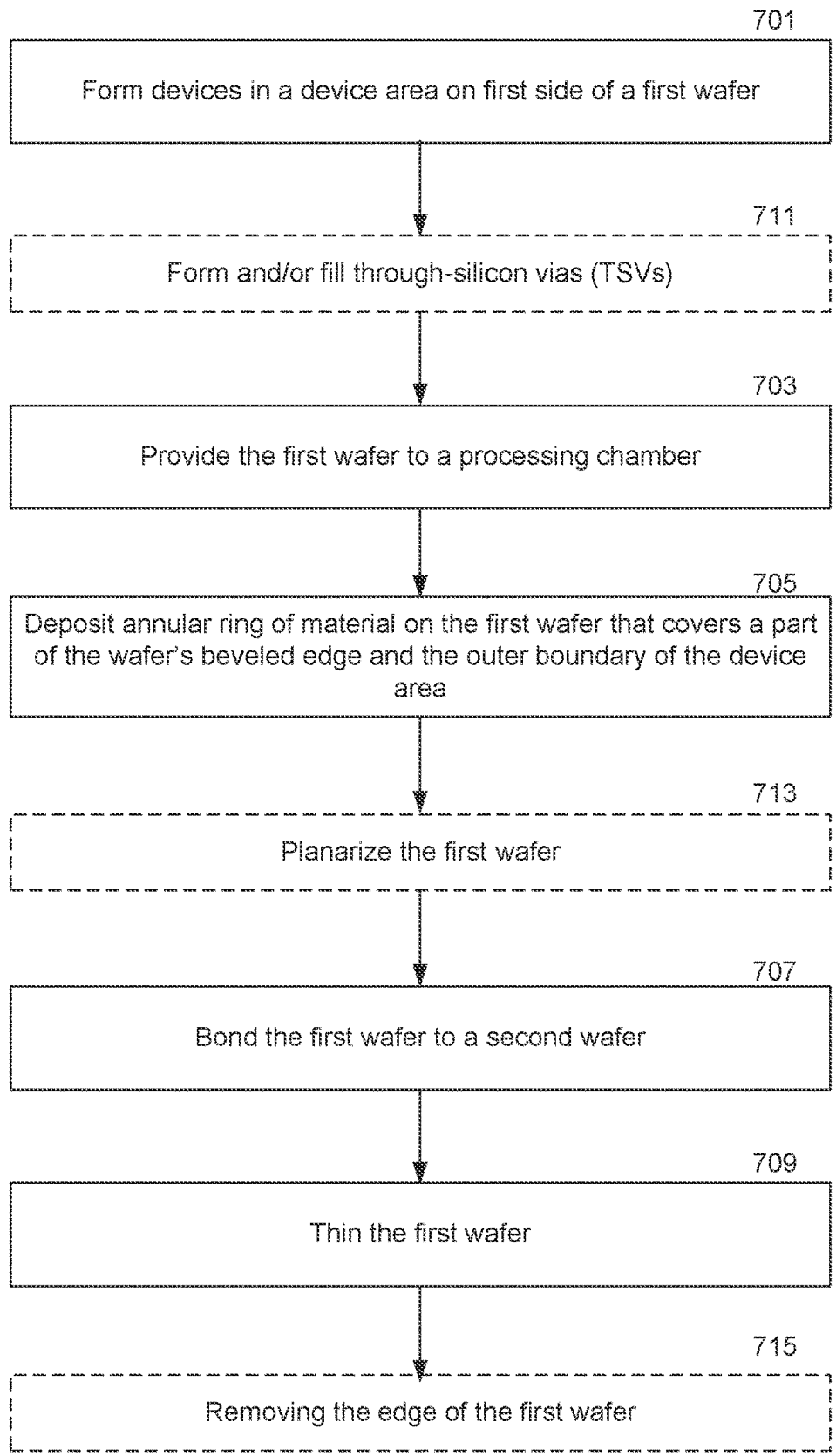
FIG. 7 depicts a second example technique according to some implementations.

FIG. 7 depicts a second example technique according to some implementations. Here, operations 701, 703, 705, 707, and 709 are consistent with operations 101, 103, 105, 107, and 109, respectively, as described above. Optional operation 711 may form and/or fill the TSVs in the first wafer; this operation may be performed in between operations 701 and 703 as shown in some instances, and in other instances in different order, such as after thinning operation 709.

Figure 8:
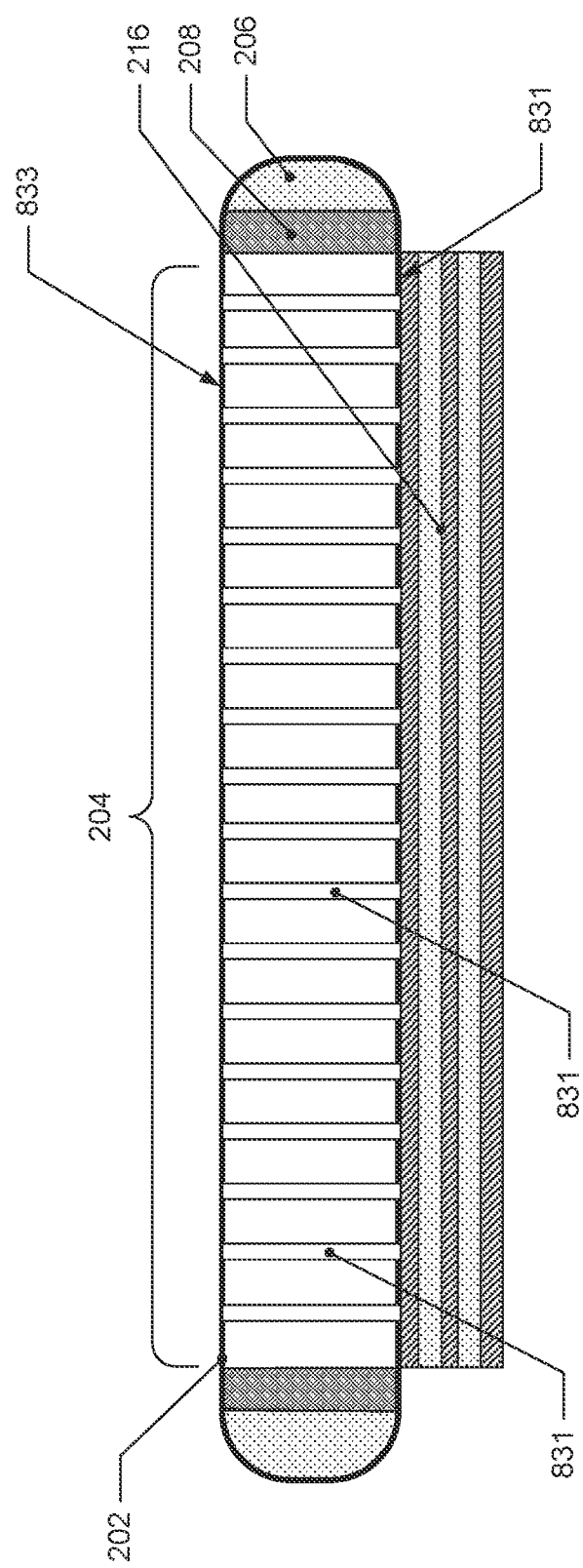
FIG. 8 depicts a wafer with a plurality of through-silicon vias (TSVs).

A TSV is a via for an electrical connection passing completely through a semiconductor work piece, such as a silicon wafer or die. A typical TSV process involves forming TSV holes and depositing a conformal diffusion barrier and conductive seed layers on a substrate, followed by filling of the TSV holes with a metal. FIG. 8 depicts a wafer with a plurality of TSVs. As can be seen, wafer 802 includes a plurality of TSVs 831 that extend through the wafer 202 from the wafer's backside 833 to the plurality of devices 216 on the first side of the wafer 202.

TSV holes typically have high aspect ratios which makes void-free deposition of copper into such structures a challenging task. TSVs typically have aspect ratios of 4:1 and greater, such as 10:1 and greater, and even 20:1 and greater (e.g., reaching about 30:1), with widths at opening of about 0.1 µm or greater, such as about 5 µm or greater, and depths of about 5 µm or greater, such as about 50 µm or greater, and about 100 µm or greater. Examples of TSVs include 5×50 µm and 10×100 µm features. Such large recessed features, when coated with acid-sensitive seed layers are particularly difficult to fill using conventional techniques. Chemical vapor deposition (CVD) of copper requires complex and expensive precursors, while physical vapor deposition (PVD) often results in voids and limited step coverage. The process of depositing, or plating, metal onto a conductive surface via an electrochemical reaction is referred to generally as electroplating, plating, or electrofilling. Electroplating is a more common method of depositing copper into TSV structures. In a typical TSV electrofilling process, the substrate is negatively electrically biased and is contacted with a plating solution which may include copper sulfate as a source of copper ions, sulfuric acid for controlling conductivity, and several organic additives known as suppressors, accelerators and levelers.

In another optional operation 713, one or more aspects of the wafer may be planarized, including the deposited annular ring of material. This planarization may reduce the height of the deposited annular ring of material which may be advantageous, in some instances, for bonding with the second wafer by providing, for example, a flat, planar bonding surface as well as allowing the second wafer to be positioned close to the first wafer. Referring back to FIG. 3D, the deposited annular ring of material 318 has a height 326 greater than the height 328 (or nominal height) of the plurality of devices 216. It may be advantageous in some instances to reduce the annular ring of material's 318 height 326 so that it is even or substantially even (e.g., within +/−10%, 5%, or 1%) with the devices' 216 height 328.

Figure 3E:
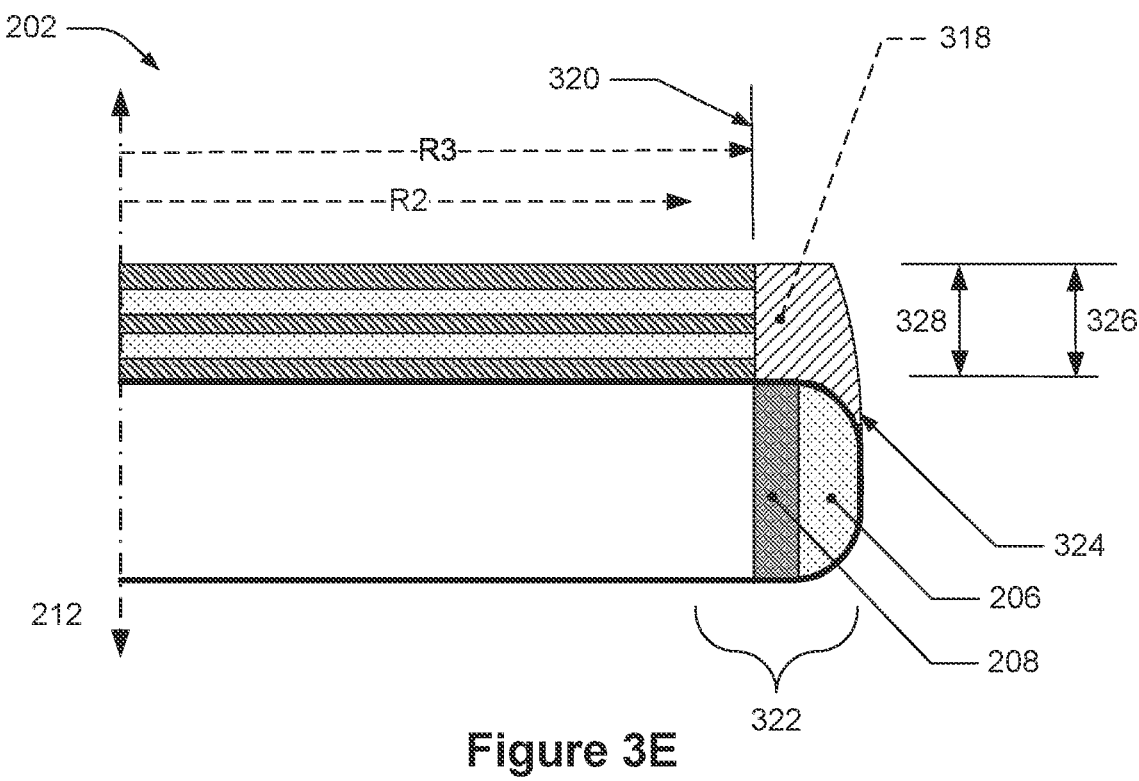
FIG. 3E depicts the wafer of FIG. 3D after a planarization operation.

FIG. 3E depicts the wafer of FIG. 3D after a planarization operation. As can be seen here, the annular ring of material 318 has been flattened and reduced in height 326 so that its height 326 is equal, or substantially equal, to the height 328 of the plurality of devices 216. The flattening may assist with bonding by providing a flat, uniform surface and the reduced height may also assist with bonding by allowing the second wafer to be positioned in contact with, or closer to, the first wafer. In some instances, it may be desirable to place the first and second wafer closer to each other than the height 326 of the annular ring of material 318 following deposition. This may include placing the two wafers' plurality of devices in contact with each other as shown in FIG. 5D and described above. For example, the reduced height 326 of the annular ring of material 318 of wafer 202 of FIG. 3E, may enable the plurality of devices 216 to be in contact with the plurality of devices of another wafer.

In some instances, the planarization may also adjust the inner boundary of the annular ring of material. As illustrated with FIGS. 3D and 3E, the planarization in this example moved the inner boundary 320 of the annular ring of material 318 radially outwards farther from the center 212. In FIG. 3E, the inner boundary 320 has a larger radius R3 than the radius R2 in FIG. 3D after deposition and before planarization.

In some embodiments, the planarization may be employed by etching the annular ring of material. This etching may be accomplished in a reactor that is configured to etch an annular region of the wafer. Similar to the depositing of the annular ring of material, this etching may include using a plasma and a reactor configured to confine that plasma to a geographical ring around the wafer. This may be performed using, for example, a plasma exclusion zone ring described in greater detail below. The etching may therefore be confined to an annular region of the first wafer which may overlap with and cover some or all of the annular ring of material.

Figure 3F:
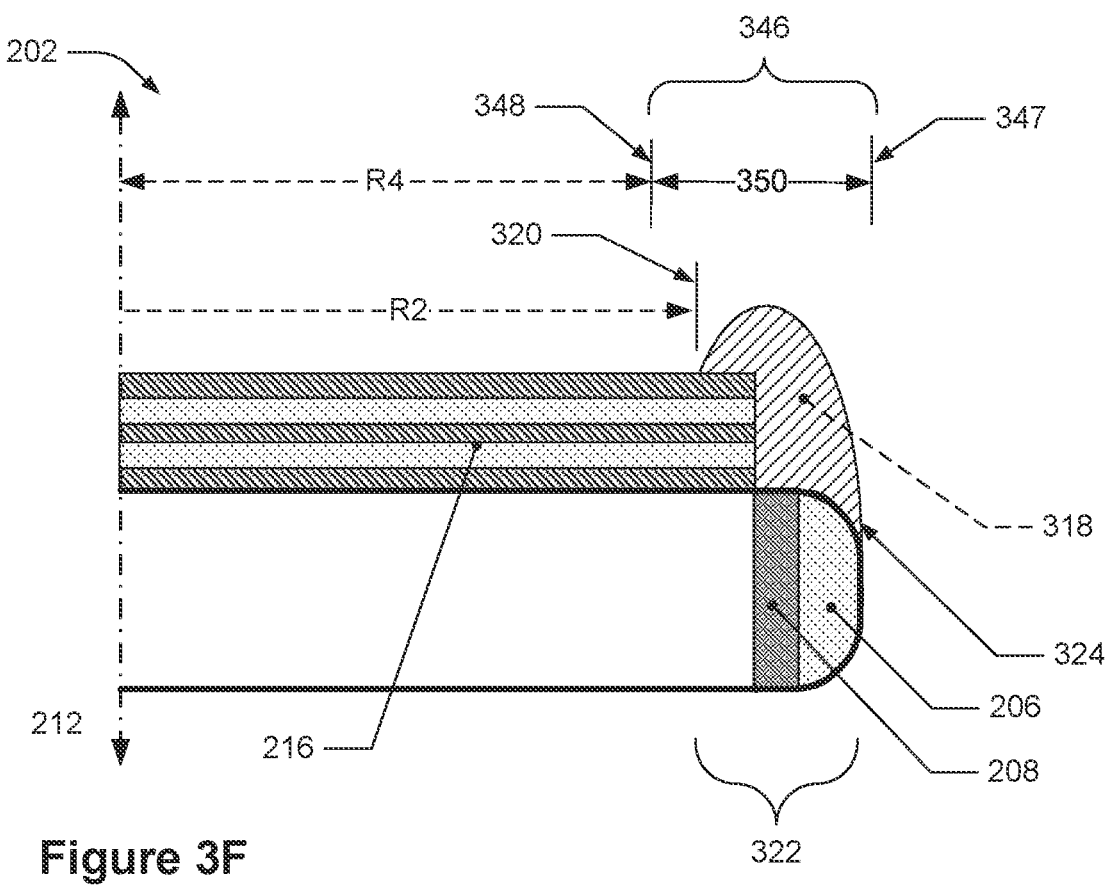
FIG. 3F depicts the wafer of FIG. 3D and an etching region.

FIG. 3F depicts the wafer of FIG. 3D and an etching region. Here, etching is performed in an annular region 346 that extends around all of the wafer 202, has an inner boundary 348 with a radius R4 and a radial thickness 350. This annular region 346 covers at least some of the annular ring of material 318 and in some embodiments, this annular region has an inner boundary 348 and radius R4 that are smaller than the radius R2 and inner boundary 320 of the annular ring of material such that the inner boundary 348 is closer to the center 212 than the inner boundary 320. This configuration of the annular region 346 in which etching is performed enables the annular ring of material 318 to be selectively etched. The outer boundary 347 of this annular region in which etching is performed, may be substantially equal with the outer boundary 324 of the annular ring of material 318. In some embodiments, the annular region 346 may be equal, or substantially equal, to the annular region of material, such as the positioning of their inner and outer boundaries and/or radial thicknesses. Similar to above, the boundaries of this annular region 346 may not be exact, precise features and instead may be considered average, nominal values.

Figure 9A:
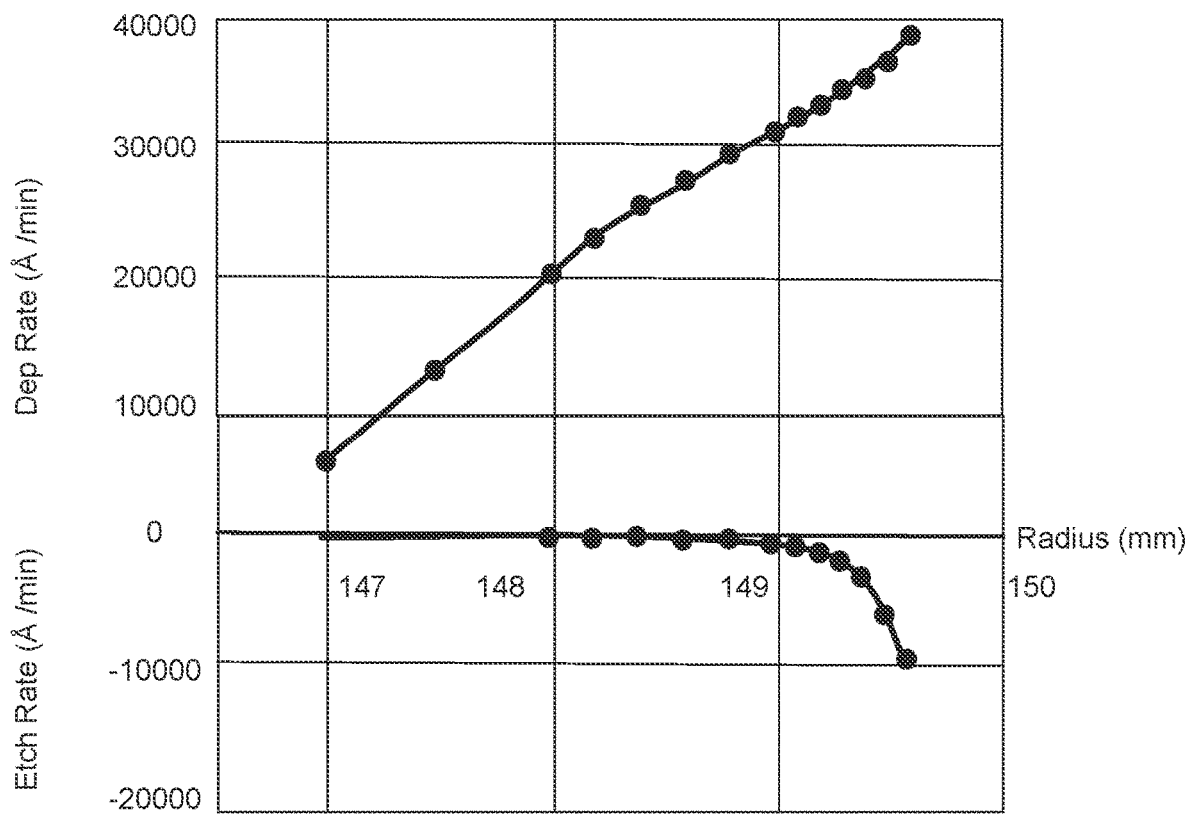
FIG. 9A depicts example deposition and etch rates for a wafer.
Figure 9B:
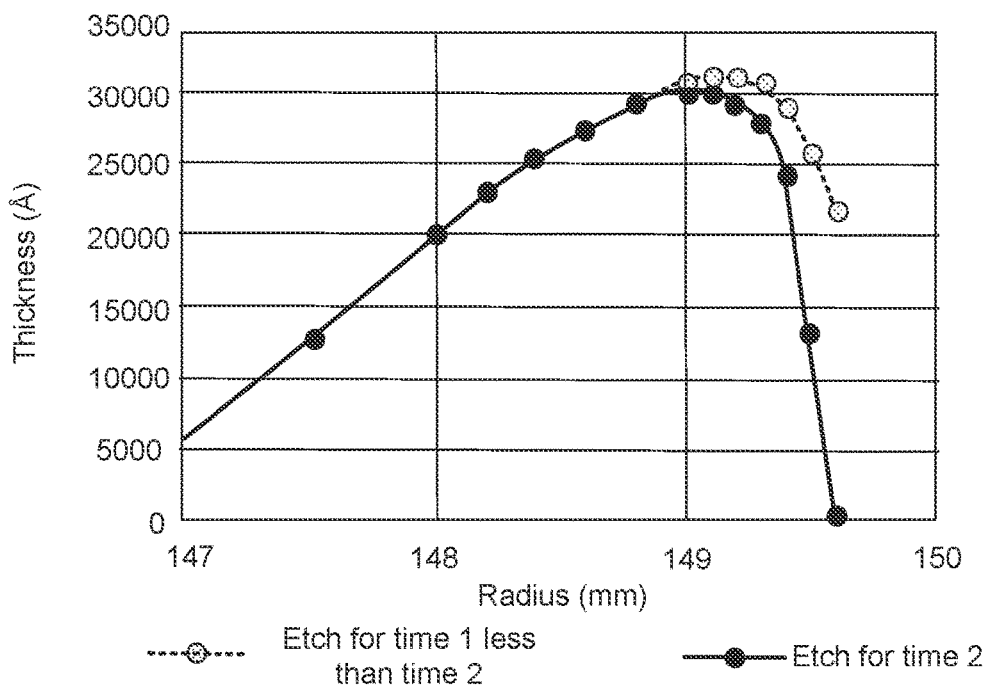
FIG. 9B depicts example thicknesses of deposited material after deposition and etching.

This etching can be used to modulate the geometry of the annular ring of material. FIG. 9A depicts example deposition and etch rates for a wafer and FIG. 9B depicts example thicknesses of deposited material after deposition and etching. In the top portion of FIG. 9A, the deposition rate is shown which increases substantially linearly as the radial distance increases from 147 mm to 150 mm. This may result in depositing an annular ring of material that has a linear profile. After this depositing, the annular ring of material may be etched in an annular region that may span between about 148.5 mm and 149.5 mm, as illustrated with a non-zero etching rate in this region. The etching rate within this region may be non-linear, as shown, in order to etch various aspects of the annular region of material more than others, such as etching the radially outwards area of the ring of material more than an inwards region which may be advantageous if it is desired to remove more of the material in that area.

The etching rate and time may affect the resulting thickness and profile of the annular ring of material. As illustrated in FIG. 9B, which shows the thicknesses of the same annular ring of material after two different etching processes, the thickness has been reduced more after the etching of time 2 which is longer than time 1. For instance, the thickness of this material at a radial position of about 149.5 mm after etching for time 1 is about 22,000 Å, while after etching the same material for time 2, the thickness at this same radial position is about 0 Å. Accordingly, the time for which the annular ring of material is etched may further modulate the geometry of the annular ring of material after it is deposited. In some embodiments, the depositing and the etching may be performed in separate reactors.

In some embodiments, the planarization may be accomplished by chemical mechanical polishing/planarization (CMP) which removes material by a combination of chemical and mechanical (e.g., abrasive) forces. This may include using an abrasive and corrosive chemical slurry (sometimes referred to as a colloid) along with a pad that may be greater in diameter than the wafer. The colloid is placed on the wafer, the pad is physically pressed onto the wafer, and the pad is caused to move over the wafer to thereby remove aspects of the wafer, such as some of the annular ring of material. In some embodiments, both etching and CMP may be performed on the wafer.

Referring back to FIG. 7, another optional operation 715 includes removing the edge of the first wafer, and in some instances the edges of the bonded first and second wafers. Wafer edge removal removes of an outer edge region of the wafer, such as the beveled edge discussed herein, to leave the wafer and plurality of devices remaining. This may include physical removal, such as by grinding or cutting, the wafer. In many edge removal operations, some die material may be lost because of damage caused by the trimming process, and/or because of pervious damage and the removal process removes this damaged portion. With the deposited annular ring of material on the wafer, edge removal-related loss can be reduced because additional support is provided to the wafer which reduces stress and damage to the edge of the plurality of devices, thereby requiring less edge material to be removed. In some conventional processing, about 2 to 3 mm of radial die loss can occur, but using the techniques described herein, this radial die loss can be reduced to less than about 2 mm, about 1.5 mm, about 1 mm, about 0.7 mm, about 0.5 mm, or about 0.3 mm. In some instances, this removal removes some, all, or substantially all (e.g., at least 90%, 95%, or 99%) of the annular ring of material from the first wafer. For two wafers bonded together that both have a plurality of devices formed or partially formed thereon, this removal may remove some, all, or substantially all (e.g., at least 90%, 95%, or 99%) of the annular ring of material from the first and second wafers.

In some embodiments, one or more of the optional operations may be performed. For instance, in some such implementations, all of optional operations 711, 713, and 715 may be performed, while in others, only one or two of these operations may be performed.

Some of the techniques provided herein may control and/or adjust the deposition conditions for depositing the annular ring of material in order to control and/or change the radial thickness and/or height of the annular ring of material. This control and/or adjustment may be made in order to deposit an annular ring of material with a height and/or radial thickness that can cover the edge region of differently shaped and sized devices and their outer edges and profiles.

Figure 10:
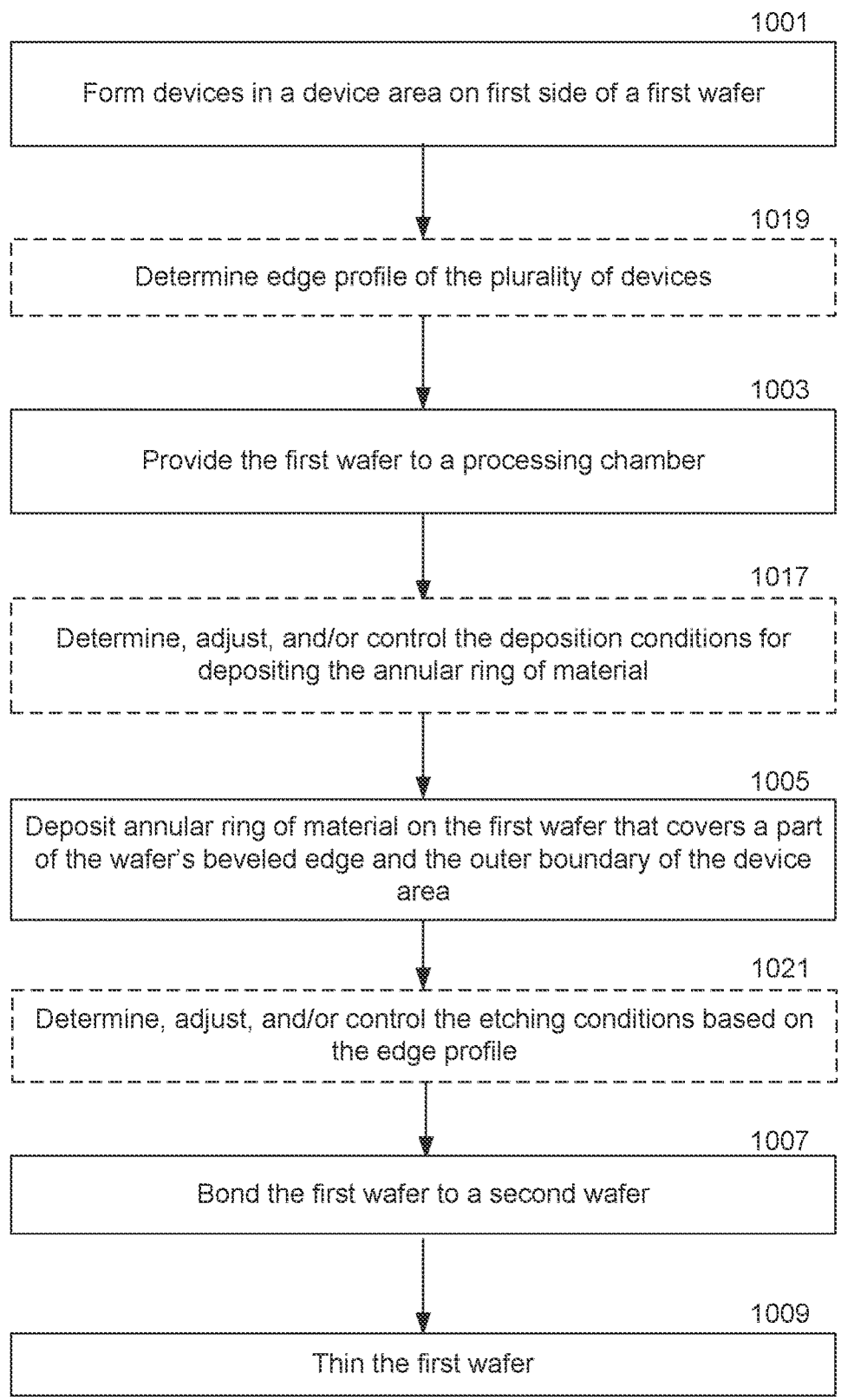
FIG. 10 a third example technique according to some implementations.

FIG. 10 depicts a third example technique according to some implementations. Here, operations 1001, 1003, 1005, 1007, and 1009 are consistent with operations 101, 103, 105, 107, and 109, respectively, as described above. However, this third example technique includes an optional determination, adjustment, and/or control of the deposition conditions for depositing the annular ring of material as represented by operation 1017. In some embodiments, this determination, adjustment, and/or control may cause the radial thickness of the annular ring of material to increase or decrease, and/or cause the nominal height of the annular ring of material to increase or decrease. For example, referring back to FIG. 4A, in order to deposit the annular material ring of material 418 on the edge region 430 of this wafer's 402A plurality of devices 416, the deposition conditions may be determined, adjusted, and/or controlled to cause the inner boundary 420 to be on, substantially on (within +/−5%), or less than the beginning of the edge profile 430, which is the first point 432 or may be considered an inner radial boundary of the edge profile. This may also cause the outer boundary 424 to cover some or all of the beveled edge 406, which results in the radial thickness 422 of the annular ring of material 418 covering the edge profile 430. This determination and/or adjustment may be considered the ability to control the deposition conditions of the annular ring of material as well as control of characteristics of the annular ring of material.

Similarly, referring back to FIG. 4B, in order to deposit the annular material ring of material 418 on the edge region 430 of this wafer's 402B plurality of devices 416, the deposition conditions may be determined, adjusted, and/or controlled to cause the inner boundary 420 to be on, substantially on (within +/−5%), or less than the beginning of the edge profile 430, which is the first point 432. As compared to wafer 402A in FIG. 4A, this determination, adjustment, and/or control may decrease the inner boundary 420 of wafer 402B, and thus decrease radius R2, which in turn increases the radial thickness 422 of annular ring of material 418 on wafer 402B.

The adjustments, control, and/or determinations of deposition conditions may also increase or decrease the height of the annular ring of material so that this material can cover an edge profile of the plurality of devices that have various heights. This may include causing the height of the annular ring of material to be greater than the nominal height of the plurality of devices. In some embodiments, the adjustments, control, and/or determinations of depositions conditions may cause both the annular ring of material to cover the edge profile and the height of the annular ring of material to be greater than the nominal height of the plurality of devices.

The adjustments, control, and/or determinations of depositions conditions may be various changes to the chamber and/or deposition parameters. For example, a separation distance between the wafer and the gas distribution device may be changed which can change gas flow characteristics and in turn, change the annular ring of material's characteristics and/or geometry. For example, in some embodiments, decreasing this separation distance, or gap, may increase the process gas flowrate across the wafer during the depositing which can increase the inner boundary 320 and the radius R2 which decreases the radial thickness 322 of the annular ring of material. Conversely, increasing this separation distance may decrease the inner boundary 320 and the radius R2 which can increase the radial thickness 322; increasing the separation distance and/or deposition time may also cause the height of the deposited material to increase. Another adjustment may be to the gas flowrate itself; in some embodiments, decreasing the flowrate may decrease the inner boundary 320 and the radius R2 which increases the radial thickness 322 of the annular ring of material. This flowrate increase may also decrease the height of the annular ring of material.

In some embodiments, these adjustments, control, and/or determinations of depositions conditions may be made before the depositing, while in some other embodiments, they may be made during the depositing. For instance, these adjustments, control, and/or determinations of depositions conditions may be made before the depositing and the conditions during all of the depositing remain at these conditions. In some other instances, one or more adjustments may be made during the depositing in order to further adjust the geometry of the annular ring of material. This may include, for example, decreasing the separation distance, or gap, throughout deposition which may create less encroachment, e.g., a thinner film at the inner radius.

In some embodiments a determination of the edge profile of the plurality of devices on the wafer device area may be made. This determination, or determinations, may be used to adjust, control, and/or determine the deposition conditions of the annular ring of material and/or adjust, control, and/or determine the etching conditions performed on the annular ring of material. In FIG. 10, this determination is represented by operation 1019 which may be performed, in some embodiments, before, during, or after the first wafer is provided to the processing chamber, and before the deposition is performed in operation 1005.

Figure 11A:
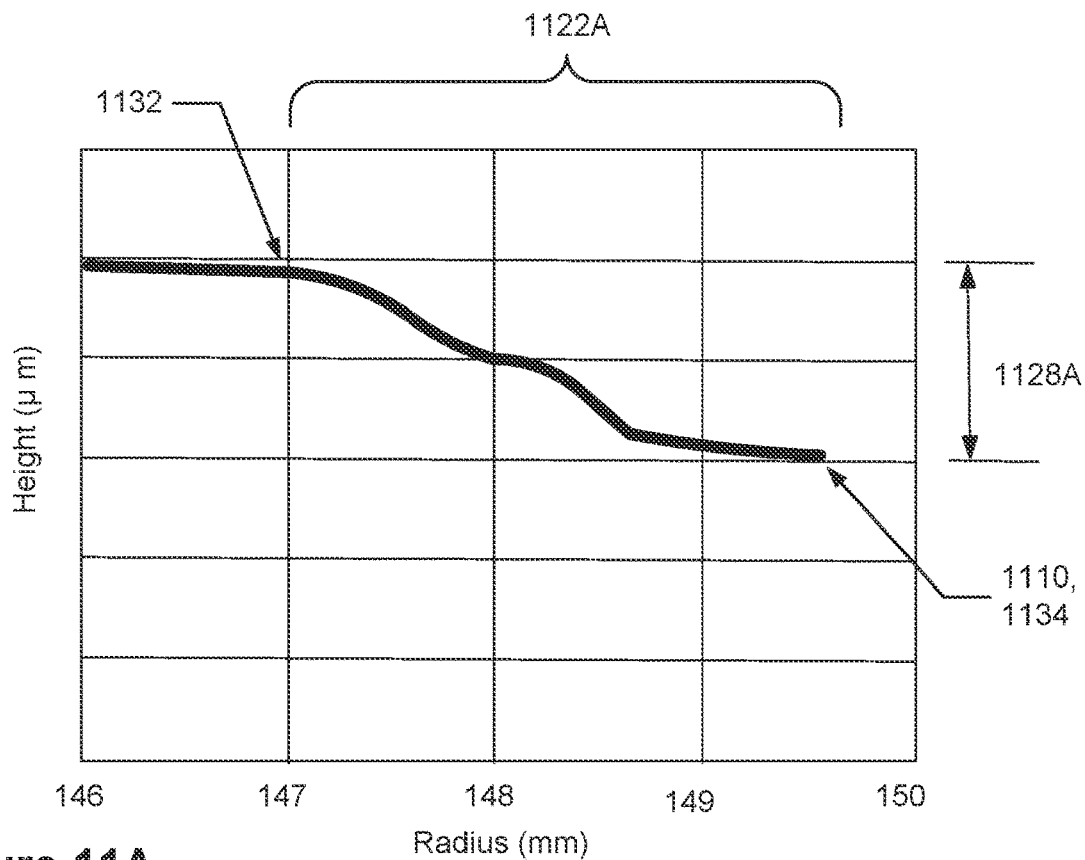
FIGS. 11A and 11B depict measurements of two example cross-sectional edge profiles.
Figure 11B:
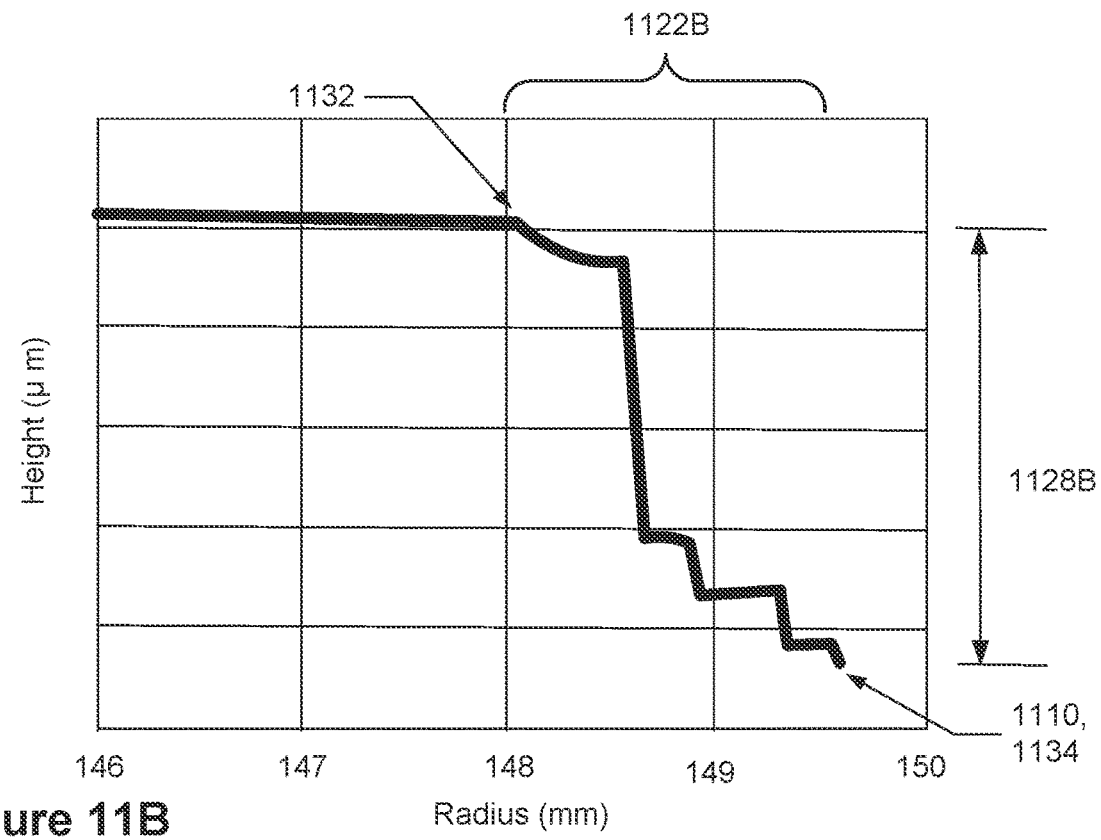

The edge profile determination may include various aspects of the profile, including its inner radial boundary, outer radial boundary, height, and/or shape. Referring back to FIG. 4A, the edge profile 430 includes the first point 432, which may also be considered the inner radial boundary, the second point 434 which may also be considered the outer perimeter 410 of the device area 404, and the height 428. The shape of the edge profile 430 may be the cross-sectional shape, such as a curve, linear slope, stepped, or other non-linear shape. For instance, FIGS. 11A and 11B depict measurements of two example cross-sectional edge profiles. The measured edge profile 11A has an approximate first point 1132 (or inner boundary) at approximately 147 mm from the center of the wafer and has a gradual slope to the outer boundary 410 (or second point 434) at about 149.5 mm and has a first height 1128A. In contrast, the edge profile 118 has a taller, steeper slope with an approximate first point 1132 (or inner boundary) at about 148 mm from the center of the wafer and has a steep slope to the outer boundary 410 or second point 434 at about 149.5 mm with a second height 1128B that is about double the size of the first height 1128A. An annular ring of material with one particular geometry deposited on wafers with these profiles may not be able to fully cover both of these edge profiles; rather, adjustments to the deposition conditions may be needed to adjust the annular ring of material's inner boundary and height to adequately cover each of these different profiles.

Accordingly, this information may be determined and then used to make any of the adjustments provided herein, including adjusting the deposition conditions to cause the annular ring of material to cover the edge profile, to cause a nominal height of the annular ring of material to be greater than a height of the plurality of devices, or both. For instance, referring to the two example edge profiles in FIGS. 11A and 11B, the depositions conditions may be adjusted to cause the annular ring of material to be deposited on and cover the edge profile on either of these wafers. When depositing the annular ring of material on the wafer in FIG. 11A, the deposition conditions may be adjusted to cause the inner radial boundary to be at or radially inwards from the first point 1132 at about 147 mm and have a height greater than about the first height 1128A. This may also cause the radial thickness 1122A of the annular ring of material in FIG. 11A to be about 2.5 mm. When depositing the annular ring of material on the wafer in FIG. 11B, deposition conditions may be adjusted to cause the inner radial boundary to be at or inwards from the first point 1132 at about 148 mm, to cause the height of the material to be greater than about the second height 1128B, and to cause radial thickness 1122B of the annular ring of material to be about 1.5 mm.

Similar to the deposition conditions, the etching conditions may be determined, controlled, and/or adjusted. In some embodiments, the edge profile information may be used to control, determine, and/or make adjustments to etching conditions as well as to the annular region in which etching is performed. This is represented as optional operation 1021 in FIG. 10. Here, the etching conditions may be adjusted, determined, and/or controlled, based on the edge profile of the plurality of devices, to cause, for example, the annular region in which etching is performed to cover, or at least partially overlap with, the annular ring of material. Referring back to FIG. 3F, the etching conditions may be determined, controller, and/or adjusted to cause the inner boundary 348 to be on, substantially on (within +/−5%), or less than the beginning of the edge profile 430, which is the first point 432 or may be considered an inner radial boundary of the edge profile. This may also cause the outer boundary 347 to cover some or all of the beveled edge 406, which results in the radial thickness 350 of the annular region 346 covering the edge profile 430 and the annular ring of material 318. This may further include causing the radial thickness 350 of this etching region 346 to be greater than or substantially equal to the annular thickness 422 of the annular ring of material. Other etching conditions may be determined, controlled, and/or adjusted, such as the etching rate.

This determination of the edge profile may be made in various manners, such as measuring the edge profile, measuring a flatness of the wafer, and/or calculating/estimating the profile. In some embodiments, the edge profile may be measured using a laser or imaging device configured to determine the height of this profile. Imaging devices can include, but are not limited to, laser scanning microscopes, laser profilers, and optical profilometers, for instance.

In some embodiments the flatness of the wafer may be measured. This may be accomplished by using an emitter and receiver positioned on opposite sides of a chamber with the wafer interposed therebetween. The emitter is configured to transmit a signal (e.g., a laser or other suitable light signal) through a gap between the wafer and a gas distribution device, e.g., a showerhead, toward the receiver. The receiver senses, receives the light signal and provides a signal to a system controller indicative of characteristics of the light signal. For example, the signal provided to the system controller may be indicative of a beam intensity of the light signal as measured by the receiver. The system controller is configured to calculate a thickness of the substrate and/or a width of the gap based on the measured characteristics of the light signal. Although the beam intensity is provided as one example, other characteristics of the light signal that may be measured with a suitable sensor include, but are not limited to, energy, width, etc.

For example only, the beam intensity of the light signal may depend upon a thickness of the light signal that is permitted to pass through the effective gap. In other words, if the substrate is thicker or the effective gap is otherwise reduced (e.g., due to manufacturing tolerances, contraction and expansion of components over time, component wear, etc.), less of the light signal will be able to pass through the gap toward the receiver. Conversely, if the substrate is thinner or the effective gap is otherwise increased, more of the light signal will be able to pass through the gap. Accordingly, a laser intensity I has a proportional relationship with the gap $T_G$ and an inversely proportional relationship with a substrate thickness. A signal transmitted from the receiver to the system controller is proportional to the measured laser intensity. For example, the receiver may be configured to generate a measurement signal having a voltage indicative of the laser intensity. The system controller is configured to calculate the effective gap and/or the substrate thickness based on the measured laser intensity. In some examples, the system controller may store data (e.g., e.g., calibration data stored in a lookup table) that correlates laser intensity to known gaps and/or substrate thicknesses. The data may include an initial, calibrated gap value and corresponding laser intensity measured during manufacturing, servicing, etc. Calibration data may include laser intensity measurements for a nominal (e.g., ideal) gap with and without a substrate (e.g., a substrate having a known nominal or expected thickness) present.

In some embodiments, the determination may be made using calculations and/or estimates, and not necessarily measured or experimental data. These calculations may determine the profile based on known and probable characteristics of the edge profile given the processing performed on the wafer. Any of the measurements, calculations, and/or determinations may be used in feedforward or feedback loops for processing the wafer or subsequent wafers. This may include measuring the processed wafer's profile and feeding that data back to the system to adjust the process conditions for one or more subsequently processed wafers.

In some embodiments, this determination may be made in the processing chamber in which the depositing, the etching, or both are performed. In some of these embodiments, the one or more sensors described above may be integrated within the processing chamber as described herein. This may include, for instance, one or more sensors positioned within the chamber, such as inside the interior volume defined by the chamber, within or outside the chamber walls but nevertheless configured to measure the wafer inside the chamber, such as through a window or port in the chamber walls, top, and/or bottom. For example, this may include the emitter and receiver positioned on opposite sides of the chamber with the wafer interposed therebetween discussed above.

In some other embodiments, this determination may be made outside the processing chamber in which the depositing, the etching, or both are performed, such as in a load-lock or wafer transfer area. In some such embodiments, a controller of the apparatus may receive measurement data conducted outside the reactor and use such data to make any determinations provided herein and adjust the deposition conditions, etching conditions, or both as described herein. An example would be an in-line metrology system capable of measuring the edge profile of an incoming or processed wafer to provide information to the system for a feed forward or feedback control loop.

Apparatuses

The apparatuses provided herein are configured to perform deposition, etching, or both, in one or more annular regions around a wafer and not the entire wafer. In some instances, the deposition and etching may be performed in different reactors, chambers, or stations (which may be within the same chamber). In some embodiments, the apparatuses may include a plasma-exclusion-zone ("PEZ") that allows a plasma to be generated in one zone and prevents a plasma from being generated in another zone. The plasma generated in the one zone causes the deposition, etching, or both to occur in that zone and prevents the deposition, etching, or both from occurring in the zone without the plasma. The PEZ may be enabled by a PEZ ring that extends around the center axis of the wafer and, in some instances, overlaps with the wafer edge. The PEZ ring may be positioned above the wafer, below the wafer, or both.

Figure 12:
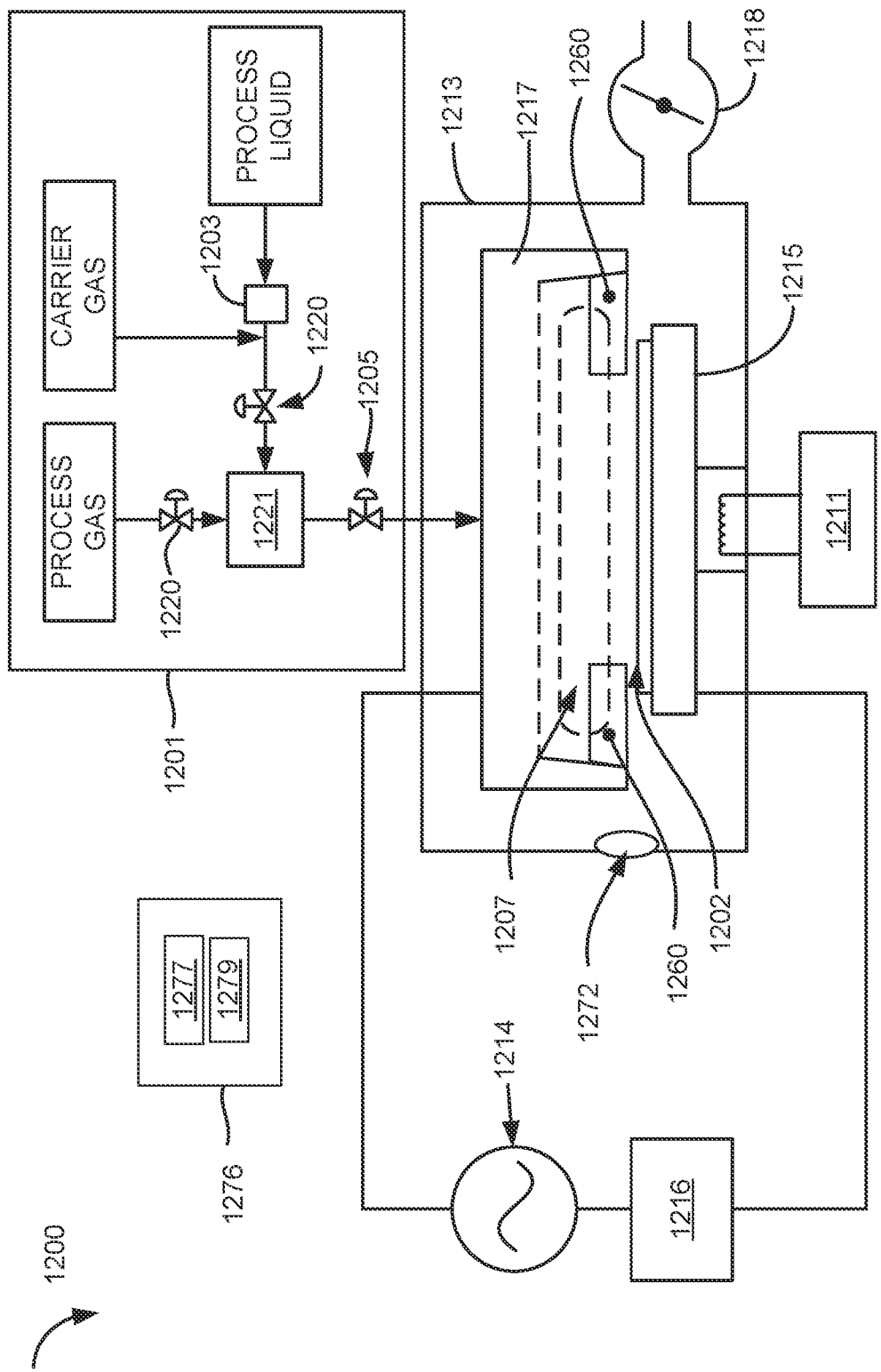
FIG. 12 schematically shows an embodiment of a process station that includes a plasma-exclusions-zone (PEZ) ring.

FIG. 12 schematically shows an embodiment of a process station 1200 that includes a PEZ ring. This process station 1200 may be used to deposit material using chemical vapor deposition (CVD), and/or atomic layer deposition (ALD), either of which may be plasma enhanced, such as plasma-enhanced chemical vapor deposition (PEVCD). The PEZ ring 1260 is used to control an etch rate and/or a deposition rate at peripheries of wafers. The PEZ ring 1260 and the other PEZ rings disclosed herein may each include a ring-shaped body formed of aluminum oxide, aluminum nitride, silicon, silicon carbide, silicon nitride, and/or yttria.

For simplicity, the process station 1200 is depicted as a standalone process station having a process chamber body 1213 for maintaining a low-pressure environment. However, it will be appreciated that a plurality of process stations 1200 may be included in a common process tool environment. Further, it will be appreciated that, in some embodiments, one or more hardware parameters of process station 1200, including those discussed in detail below, may be adjusted programmatically by one or more computer controllers.

Process station 1200 fluidly communicates with reactant delivery system 1201 for delivering process gases to a distribution showerhead 1217. Reactant delivery system 1201 includes a mixing vessel 1221 for blending and/or conditioning process gases for delivery to showerhead 1217. One or more mixing vessel inlet valves 1220 may control introduction of process gases to mixing vessel 1221. Similarly, a showerhead inlet valve 1205 may control introduction of process gasses to the showerhead 1217.

Some reactants, like BTBAS, may be stored in liquid form prior to vaporization at and subsequent delivery to the process station. For example, the embodiment of FIG. 12 includes a vaporization point 1203 for vaporizing liquid reactant to be supplied to mixing vessel 1221. In some embodiments, vaporization point 1203 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 1203 may be heat traced. In some examples, mixing vessel 1221 may also be heat traced. In one non-limiting example, piping downstream of vaporization point 1203 has an increasing temperature profile extending from approximately 100° C. to approximately 150° C. at mixing vessel 1221.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1203. In one scenario, a liquid injector may be mounted directly to mixing vessel 1221. In another scenario, a liquid injector may be mounted directly to showerhead 1217.

In some embodiments, a liquid flow controller upstream of vaporization point 1203 may be provided for controlling a mass flow of liquid for vaporization and delivery to process station 1200. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 1217 distributes process gases toward substrate 1202. In the embodiment shown in FIG. 12, substrate 1202 is located beneath showerhead 1217, and is shown resting on a pedestal 1215. In some embodiments, the pedestal 1215 may be an electrostatic chuck (ESC). It will be appreciated that showerhead 1217 may have any suitable shape, and may have any suitable number and arrangement of ports for distributing processes gases to substrate 1202.

In some embodiments, a microvolume 1207 is located beneath showerhead 1217. Performing an ALD, CVD, and/or PECVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 1215 may be raised or lowered to expose substrate 1202 to microvolume 1207 and/or to vary a volume of microvolume 1207. For example, in a substrate transfer phase, pedestal 1215 may be lowered to allow substrate 1202 to be loaded onto pedestal 1215.

During a deposition process phase, pedestal 1215 may be raised to position substrate 1202 within microvolume 1207. In some embodiments, microvolume 1207 may completely enclose substrate 1202 as well as a portion of pedestal 1215 to create a region of high flow impedance during a deposition process.

Optionally, pedestal 1215 may be lowered and/or raised during portions the deposition process to modulate process pressure, reactant concentration, etc., within microvolume 1207. In one scenario where process chamber body 1213 remains at a base pressure during the deposition process, lowering pedestal 1215 may allow microvolume 1207 to be evacuated. Example ratios of microvolume to process chamber volume include, but are not limited to, volume ratios between 1:1 and 1:10. It will be appreciated that, in some embodiments, pedestal height may be adjusted programmatically by a suitable computer controller.

In another scenario, adjusting a height of pedestal 1215 may allow a plasma density to be varied during plasma activation and/or treatment cycles included in the deposition process. At the conclusion of the deposition process phase, pedestal 1215 may be lowered during another substrate transfer phase to allow removal of substrate 1202 from pedestal 1215.

While the example microvolume variations described herein refer to a height-adjustable pedestal, it will be appreciated that, in some embodiments, a position of showerhead 1217 may be adjusted relative to pedestal 1215 to vary a volume of microvolume 1207. Further, it will be appreciated that a vertical position of pedestal 1215 and/or showerhead 1217 may be varied by any suitable mechanism within the scope of the present disclosure. In some embodiments, pedestal 1215 may include a rotational axis for rotating an orientation of substrate 1202. It will be appreciated that, in some embodiments, one or more of these example adjustments may be performed programmatically by one or more suitable computer controllers.

Returning to the embodiment shown in FIG. 12, showerhead 1217 and pedestal 1215 electrically communicate with RF power supply 1214 and matching network 1216 for powering a plasma. In some embodiments, the process station 1200 includes an upper electrode which in some instances may be the showerhead 1217; in some other instances, the upper electrode may be positioned other locations inside or outside the process station 1200. In some embodiments, the upper electrode 1217 may include the PEZ ring 1260. The pedestal 1215 may also include a conductive surface or element that serves as a lower electrode. In some embodiments, the lower electrode may additionally, or alternatively, include a PEZ ring 1260.

In some embodiments, the plasma energy may be controlled by controlling one or more of a process station pressure, a gas concentration, an RF source power, an RF source frequency, and a plasma power pulse timing. For example, RF power supply 1214 and matching network 1216 may be operated at any suitable power to form a plasma having a desired composition of radical species. This may include coupling the RF power supply 1214 and the matching network 1216 to the upper and lower electrodes in the process chamber 1200. Examples of suitable powers are included above. Likewise, RF power supply 1214 may provide RF power of any suitable frequency. In some embodiments, RF power supply 1214 may be configured to control high- and low-frequency RF power sources independently of one another. Example low-frequency RF frequencies may include, but are not limited to, frequencies between 50 kHz and 1200 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 1215 may be temperature controlled via heater 1211. Further, in some embodiments, pressure control for deposition process station 1200 may be provided by butterfly valve 1218. As shown in the embodiment of FIG. 12, butterfly valve 1218 throttles a vacuum provided by a downstream vacuum pump (not shown). However, in some embodiments, pressure control of process station 1200 may also be adjusted by varying a flow rate of one or more gases introduced to process station 1200.

Figure 13:
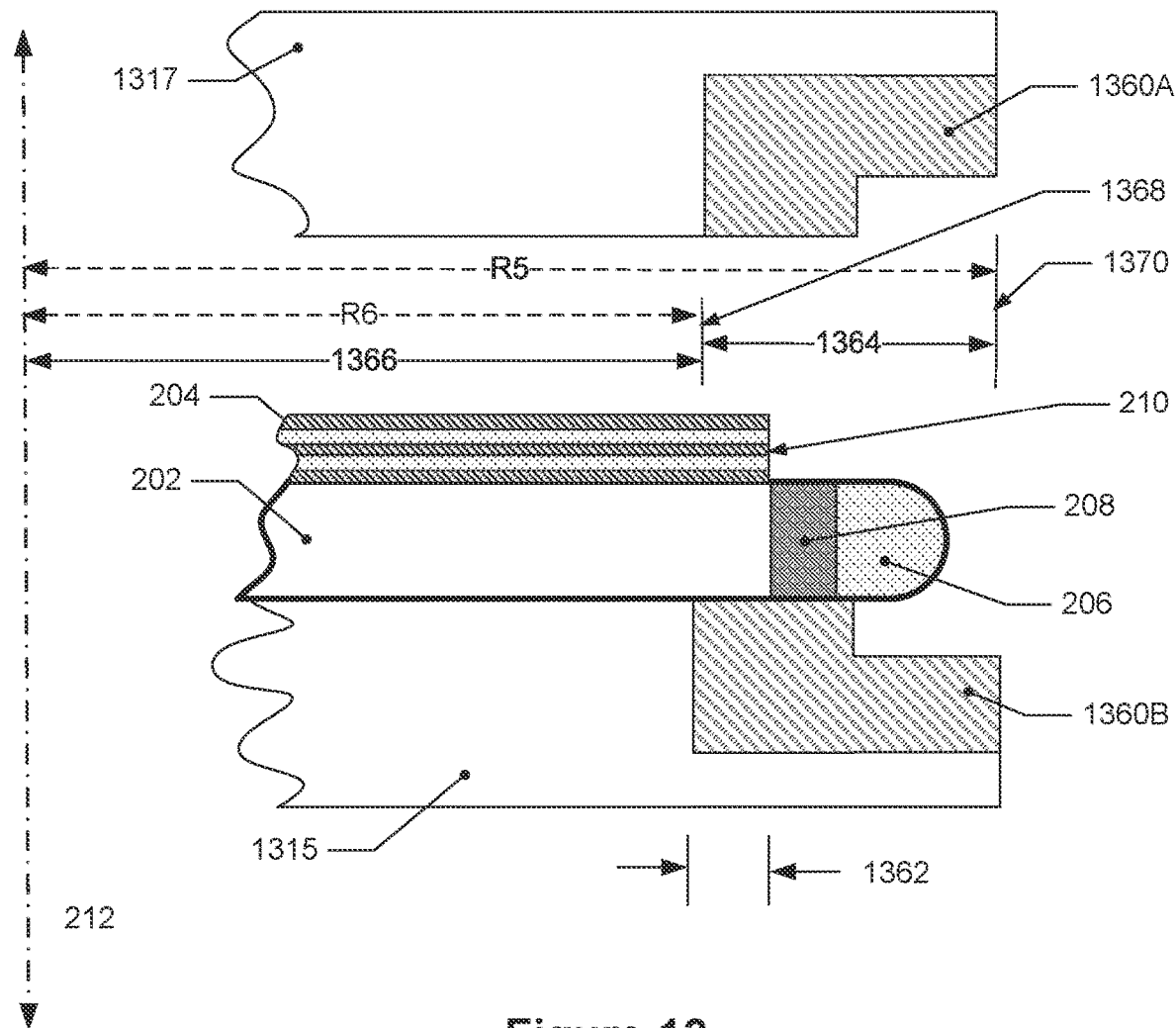
FIG. 13 depicts a partial cross-sectional view of an example pedestal, wafer, and a PEZ ring.

FIG. 13 depicts a partial cross-sectional view of an example pedestal, wafer, and a plasma exclusion zone ring. Here, the wafer 202 is positioned on the pedestal 1315 and the gas distribution device, e.g. 1317, is positioned above the wafer 202. FIG. 13 also depicts two PEZ rings 1360A and 1360B (shown with cross-hatching) and although two PEZ rings are included, some embodiments may only include one PEZ ring above or below the wafer. Both PEZ rings 1360A and 1360E extend around the center axis 212 of the wafer 202, overlap with the beveled edge 206, the annular edge region 208, and a portion 1362 of the device area 204. The outer diameter of these PEZ rings 1360A and 1360B is also, in some embodiments, greater than the outer diameter of the wafer 202, as shown in FIG. 13.

Each of these PEZ rings 1360A and 1360B are configured to enable plasma to be generated in an annular region or zone above the wafer which may include at least some of the wafer covered by the PEZ ring. As noted above, some embodiments may include one of these PEZ rings. In FIG. 13, zone 1364 represents an area over the wafer in which plasma may be generated while zone 1366 represents an area over the wafer in which plasma is not generated (or has limited or negligible plasma generation). Zone 1364 extends around the center axis, may be considered an annular ring, may have an outer boundary 1370 with a radius R5 greater than the radius of the wafer 202, and may have an inner radius R6, which defines an inner boundary 1368, closer to the center axis 212 than the outer boundary 210 of the device area 204. In some embodiments zone 1366 may be considered a circle centered on the center axis 212. Similar to above, the boundaries of these zones may not be precise or exact, and may instead be considered nominal boundaries. For example, zone 1364 may have an inner boundary similar to that of item 318 in FIG. 3C and inner boundary 1368 is considered an average, nominal boundary.

As stated above, generating a plasma in zone 1364 allows for deposition and/or etching to occur in this zone 1364 while preventing (or minimizing) such deposition and/or etching from occurring in zone 1366. In some embodiments, this zone 1364 may be considered the annular region 350 in which etching occurs described above as well as the area of the wafer on which the annular ring 318 is deposited. This may include the inner boundary 320 being the same or substantially (e.g., within +/−10%) the same as an inner boundary 1368 of the zone 1364. In some embodiments, the zone 1364 may overlap with the area on which the annular ring of material is deposited and these inner boundaries may not be aligned. For instance, the inner boundary 320 may be larger and farther radially outwards than the inner boundary 1368 of the zone 1364, while in some instances this may be reversed. As provided above, some embodiments have one PEZ ring which may be positioned above or below the wafer while other embodiments have two PEZ rings as shown in FIG. 13.

Referring back to FIG. 12, the process station 1200, or tool/apparatus, may include a controller 1276 configured to control various aspects of the apparatus in order to perform the techniques described herein. The controller 1276 (which may include one or more physical or logical controllers) is communicatively connected with and that controls some or all of the operations of a processing chamber. The controller 1276 may include one or more non-transitory memory devices 1277 and one or more processors 1279. In some embodiments, the apparatus includes a switching system for controlling flow rates and durations, the substrate heating unit, the substrate cooling unit, the loading and unloading of a substrate in the chamber, the positioning of the substrate, and the process gas unit, for instance, when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, the controller 1276 is part of an apparatus or a system, which may be part of the above-described examples. Such systems or apparatuses can include semiconductor processing equipment, including a processing tool or tools, chamber or chambers, a platform or platforms for processing, and/or specific processing components (a gas flow system, a substrate heating unit, a substrate cooling unit, etc.). These systems may be integrated with electronics for controlling their operation before, during, and after processing of a semiconductor wafer or substrate. The electronics may be referred to as the "controller," which may control various components or subparts of the system or systems. The controller 1276, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 1276 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller 276, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 1276 receives instructions in the form of data, which specify parameters for each of the processing operations to be performed during one or more operations. It should be understood that the parameters may be specific to the type of process to be performed and the type of tool that the controller is configured to interface with or control. Thus, as described above, the controller 1276 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

As noted above, depending on the process operation or operations to be performed by the apparatus, the controller 1276 might communicate with one or more of other apparatus circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

As also stated above, the controller is configured to perform any technique described above. This may include providing a first wafer to the substrate support in the processing chamber, the first wafer having a thickness, a beveled edge, a first side, and a plurality of devices formed in a device area on the first side, the device area having an outer perimeter, and depositing an annular ring of material on the first wafer, the annular ring of material covering a region of the beveled edge and the outer perimeter of the device area, and having an inner boundary closer to the center point of the first wafer than the outer perimeter.

Some apparatuses may have one or more sensors configured to determine various characteristics of the wafer. Referring back to FIG. 12, the processing chamber 1200 is shown including a sensor 1272 that is configured to measure one or more aspects or characteristics of the wafer as described herein. This may include, for instance, measuring a wafer's edge profile or flatness. The controller may be configured to receive and/or store such measurement data and make determinations about the wafer, such as its edge profile. The controller may also be configured to determine, based on the measurements, deposition conditions of the annular ring of material and/or etching conditions for etching the annular ring of material. The one or more sensors may include a laser, an optical device, a flatness detector, or a combination thereof. In some instances, these one or more sensors may be included in the processing chamber 1200 such as inside the chamber, inside the walls of the chamber, or configured to measure the wafer inside the chamber, such as through a port or window of the chamber. In some other instances, the one or more sensors may be outside the chamber, such as in another chamber or another aspect of a tool, such as a load lock or wafer transfer area.

While the subject matter disclosed herein has been particularly described with respect to the illustrated embodiments, it will be appreciated that various alterations, modifications and adaptations may be made based on the present disclosure, and are intended to be within the scope of the present invention. It is to be understood that the description is not limited to the disclosed embodiments but, on the contrary, is intended to cover various modifications and equivalent arrangements included within the scope of the claims.

What is claimed is:

1. A method, comprising:
   providing a first wafer to a processing chamber, the first wafer having a thickness, a beveled edge, a first side, and a plurality of devices formed in a device area on the first side, the device area having an outer perimeter;
   depositing an annular ring of material on the first wafer, the annular ring of material covering a region of the beveled edge and the outer perimeter of the device area, and having an inner boundary closer to the center point of the first wafer than the outer perimeter is to the center point, wherein the depositing further includes generating a plasma over an annular edge region of the first wafer and using a plasma exclusion zone to prevent the plasma from being generated closer to the center point of the first wafer than an inner boundary of the annular edge region;
   bonding a second substrate to the plurality of devices and to a portion of the annular ring of material; and
   thinning the thickness of the first wafer.

2. The method of claim 1, wherein the annular ring of material is an oxide.

3. The method of claim 2, wherein the oxide is a silicon oxide.

4. The method of claim 1, wherein the depositing includes plasma-enhanced chemical vapor deposition (PECVD).

5. The method of claim 1, wherein the annular ring of material has a nominal height of between about 1.5 µm and about 30 µm.

6. The method of claim 1, wherein the annular ring of material has a nominal radial thickness of between about 1 mm and 6 mm.

7. The method of claim 1, further comprising planarizing the annular ring of material to reduce a nominal height of the annular ring of material.

8. The method of claim 7, wherein the planarizing includes etching the annular ring of material.

9. The method of claim 8, wherein the etching includes etching an annular region of the first wafer, the annular region overlapping with the annular ring of material.

10. The method of claim 9, wherein the annular region is substantially equal to the annular ring of material.

11. The method of claim 9, further comprising:
    determining, before the depositing, an edge profile of the plurality of devices at the outer perimeter of the device area; and
    adjusting, based on the determining, the etching conditions to cause the annular region to substantially cover the annular ring of material.

12. The method of claim 7, wherein the planarizing includes chemical mechanical polishing (CMP) the annular ring of material.

13. The method of claim 7, wherein the planarizing includes chemical mechanical polishing (CMP) and etching the annular ring of material.

14. The method of claim 1, further comprising removing, after the bonding, an edge portion of the first wafer that includes the beveled edge and the annular ring of material to thereby remove the beveled edge and the annular ring of material from the first wafer.

15. The method of claim 14, wherein the edge portion has a radial thickness of less than about 2 mm.

16. The method of claim 1, further comprising:
    determining an edge profile of the plurality of devices at the outer perimeter of the device area; and
    adjusting, based on the determining, the deposition conditions to (i) cause the annular ring of material to cover the edge profile, (ii) cause a nominal height of the annular ring of material to be greater than a height of the plurality of devices, or both (i) and (ii).

17. The method of claim 16, wherein the adjusting includes adjusting a separation distance between the first wafer and a gas distribution device configured to flow gases onto the first wafer, and/or adjusting a flowrate of a process gas flowed onto the first wafer during the depositing.

18. The method of claim 16, wherein the determining includes measuring the edge profile of the first wafer.

19. The method of claim 16, wherein the determining includes measuring the flatness of the first wafer.

20. The method of claim 16, wherein the determining includes calculated information.

21. The method of claim 16, wherein the adjusting causes the inner boundary of the annular ring of material to be less than an inner radial boundary of the edge profile.

22. The method of claim 16, wherein the adjusting causes the inner boundary of the annular ring of material to be closer to the center point of the first wafer than an inner radial boundary of the edge profile.

23. The method of claim 1, further comprising forming through-silicon vias in the first wafer, the second substrate, or both.

24. The method of claim 1, wherein the second substrate is a carrier substrate without a plurality of devices.

25. The method of claim 1, wherein:
    the second substrate includes a second plurality of devices on a second side of the second substrate, and
    the bonding further includes bonding the second plurality of devices on the second substrate to the plurality of devices on the first wafer.

26. The method of claim 25, further comprising depositing, before the bonding, a second annular ring of material on the second substrate, wherein:
    the second substrate includes a second beveled edge,
    the second plurality of devices are formed in a second device area on the second side,
    the second device area has a second outer perimeter, and
    the second annular ring of material covers a second region of the second beveled edge and the outer perimeter of the second device area, and has an inner boundary closer to the center point of the second substrate than the second outer perimeter.

* * * * *